(12) United States Patent
Hayashi et al.

(10) Patent No.: US 6,743,973 B2
(45) Date of Patent: Jun. 1, 2004

(54) THERMOELECTRIC MATERIAL IMPROVED IN FIGURE OF MERIT, PROCESS FOR PRODUCING THEREOF AND PELTIER MODULE USING THE SAME

(75) Inventors: Takahiro Hayashi, Shizuoka (JP); Yuma Horio, Shizuoka (JP); Toshiharu Hoshi, Shizuoka (JP)

(73) Assignee: Yamaha Corporation, Shizuoka-ken (JP)

( * ) Notice: Subject to any disclaimer, the term of this patent is extended or adjusted under 35 U.S.C. 154(b) by 49 days.

(21) Appl. No.: 09/996,669

(22) Filed: Nov. 29, 2001

(65) Prior Publication Data

US 2002/0100499 A1 Aug. 1, 2002

(30) Foreign Application Priority Data

Nov. 30, 2000 (JP) .......................... 2000-366070
Oct. 23, 2001 (JP) .......................... 2001-325175

(51) Int. Cl.$^7$ .......................... H01L 35/34; H01L 35/28; H01L 35/30; H01L 35/16; B22F 1/00
(52) U.S. Cl. .......................... 136/201; 136/203; 136/205; 136/238; 136/240; 148/513; 419/41; 75/228
(58) Field of Search .......................... 136/200, 201, 136/203, 205, 238, 240; 148/513; 419/41; 75/228

(56) References Cited

U.S. PATENT DOCUMENTS 6,274,802 B1 * 8/2001 Fukuda et al. ............. 136/201
6,313,392 B1 * 11/2001 Sato et al. .................. 136/201

FOREIGN PATENT DOCUMENTS

| JP | 10-178218 | 6/1998 |
| JP | 11-163422 | 6/1999 |
| JP | 2002-248517 | * 9/2002 |

OTHER PUBLICATIONS

S. Miura, et al., "Texture and Thermoelectric Properties of Hot–Extruded $Bi_2Te_3$ Compound", *Materials Science and Engineering A277* (2000), pp. 244–249, no moth provided.
*Proceeding of 200 Spring conference of Japan Society of Powder and Powder Metallurgy*, p. 197, no month provided.

* cited by examiner

*Primary Examiner*—Patrick Ryan
*Assistant Examiner*—Thomas H. Parsons
(74) *Attorney, Agent, or Firm*—Dickstein, Shapiro, Morin & Oshinsky, LLP.

(57) ABSTRACT

Thermoelectric material of (Bi, Sb)(Te, Se) system is produced through a liquid quenching method and an extrusion from a die unit having an inlet portion and an outlet portion crossing each other at 30–150 degrees so that the crystal grains have an average grain size equal to or less than 30 microns and (001) planes mostly oriented in parallel to a direction in which electric current to flow, thereby achieving the figure of merit equal to or greater than $3.0 \times 10^{-3}$/K.

29 Claims, 11 Drawing Sheets

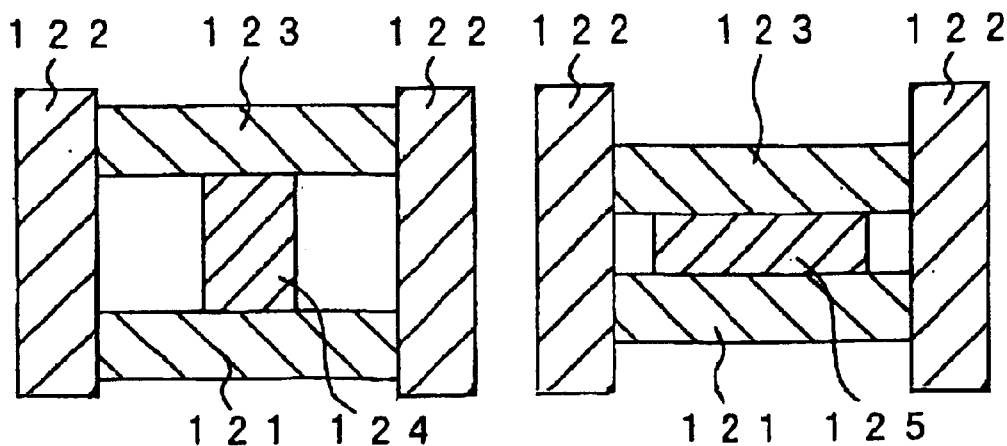
Fig. 3A PRIOR ART
Fig. 3B PRIOR ART
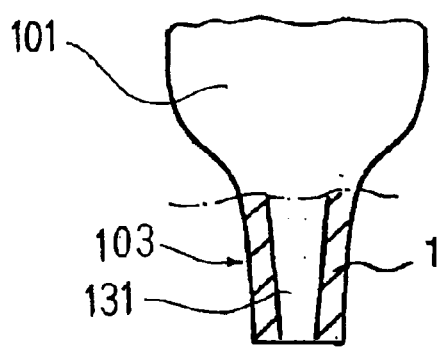
Fig. 4A PRIOR ART
Fig. 4B PRIOR ART
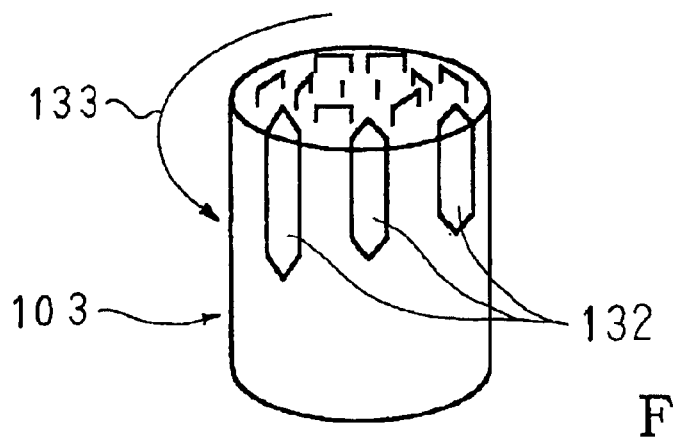
Fig. 4C PRIOR ART

THERMOELECTRIC MATERIAL IMPROVED IN FIGURE OF MERIT, PROCESS FOR PRODUCING THEREOF AND PELTIER MODULE USING THE SAME

FIELD OF THE INVENTION

This invention relates to thermoelectric material and, more particularly, to high-efficiency thermoelectric material, a process for producing thereof and Peltier module using the thermoelectric material.

DESCRIPTION OF THE RELATED ART

The figure of merit Z is convenient for evaluating the thermoelectric material, and is expressed as follows.

$$Z=\alpha^2/(\rho\times\kappa) \quad \text{equation 1}$$

where $\alpha$ is the Seebeck coefficient in $\mu\cdot V/K$, $\rho$ is the electric resistivity in $\Omega\cdot m$, $\kappa$ is the thermal conductivity in $W/m\cdot K$. The greater the figure of merit is, the more preferable the thermoelectric material is. From equation 1, it is desirable for the thermoelectric material to have a small electric resistivity and a small thermal conductivity. In general, it is known to persons skilled in the art that the thermal conductivity is reduced together with the grain size. It is also the known fact that the electric resistivity is reduced together with the number of crystal grains through which the electric current flows. Thus, the figure of merit is improved by controlling the growth of crystal.

One of the crystal structure controlling technologies is carried out by using a hot pressing. A sintered body is a typical example of the solidified thermoelectric material in $Bi_2Te_3$ system. A thermoelectric element is made from the thermoelectric material as follows. The thermoelectric material is pulverized, and the resultant powder is shaped into a sintered product through a hot pressing. While the powder is being sintered in the hot pressing, the crystal grains tend to be solidified in such a manner that a-axes of the crystal grains, which are the low-resistive direction of the crystal, are oriented in the perpendicular direction to the direction of the pressure. When the electric current flows in the low-resistive direction, the sintered product exhibits a large figure of merit. For this reason, the manufacturer spaces electrodes in the low-resistive direction on a piece of sintered product. The electric current flows through the crystal grains in the direction parallel to the a-axes, and the piece of the sintered product exhibits a large figure of merit. The piece of sintered product is used as an essential part of the thermoelectric element, and plural thermoelectric elements are assembled into a thermoelectric module.

Another crystal structure controlling technology is disclosed in Japanese Patent Application laid-open No. 11-163422. The crystal structure controlling technology disclosed in the Japanese Patent Application laid-open No. 11-163422 is carried out through an extrusion. FIGS. 1A and 1B show the prior art extrusion process. The prior art extrusion process starts with preparation of a bulk 101 of thermoelectric material as shown in FIG. 1A. The thermoelectric material has the composition containing at least one element selected from the group consisting of Bi and Sb and another element selected from the group consisting of Te and Se.

A die unit 102 is heated with a heater 104, and the bulk 101 of the thermoelectric material is pressed to the die unit 102 as indicated by an arrow in FIG. 1B. The bulk 101 is softened, and a rod 103 of the thermoelectric material is extruded from the die unit 102. While the soft thermoelectric material is passing through the die unit 102, the soft thermoelectric material is subjected to the slit orientation, and a large amount of crystal grains are oriented so as to have (001) crystal plane, i.e., c-plane in a certain direction. After the extrusion, the thermoelectric material forming the rod 103 is solidified to have fine crystal grains without changing the orientation. Although the electric resistivity $\rho$ is not varied between the bulk 101 and the rod 103, the thermal conductivity $\kappa$ is lowered.

Yet another crystal structure controlling technology is disclosed in the Proceedings of 2000 Spring Conference of Japan Society of Powder and Powder Metallurgy. According to the proceedings, a bulk of thermoelectric material is forced to pass through an elbow passage. The bulk is pressed against the inner surface, and a sharing force is exerted on the bulk of thermoelectric material for orienting the crystal grains.

FIG. 2 shows an extruder used in the prior art crystal structure controlling technique disclosed in the proceedings. Reference numeral 110 designates the die unit 110, and a passage 110a is formed in the die unit 110. The passage 110a has an elbow-like shape. A green compact 112 is formed from powder of p-type thermoelectric material expressed as $(Bi_2Te_3)_{0.2}(Sb_2Te_3)_{0.8}$. The green compact 112 is put into the passage 110a, and a punch 111 is inserted into the passage 110a. The punch 111 presses the green compact 112 against the inner surface of the die unit 110, and a sharing force is exerted on the green compact 112. The green compact 112 is bent, and a plate 113 of the thermoelectric material is extruded from the die unit 110. While the sharing force is being exerted on the green compact 112, the crystal planes are oriented in a certain direction.

Still another crystal structure controlling technology is disclosed in Japanese Patent Application laid-open No. 178218. FIGS. 3A and 3B show the process of the hot upset forging disclosed in the Japanese Patent Application laid-open. The process starts with preparation of an ingot of solid solution of thermoelectric material. The ingot is pulverized, and the resultant powder is subjected to a pressure sintering.

The sintered product 124 is placed in an inner space of the upset forging machine as shown in FIG. 3A. The upset forging machine has a base plate 121 and column-shaped sleeves 122. The base plate 121 and the sleeves 122 are assembled together so as to define the rectangular parallelepiped inner space. A punch 123 is movable in the rectangular parallelepiped inner space.

The sintered product 124 is heated, and the punch 123 is downwardly moved. A compressive force is exerted on the sintered product 124. The plastic deformation takes place in the sintered product 124, and the sintered product 124 is stretched on the base plate 121 as shown in FIG. 3B. The crystal grains of the sintered product 124 are oriented in a direction at which the figure of merit is improved. Thus, the thermoelectric semiconductor material 125 is improved in the figure of merit through the hot upset forging.

A problem is encountered in the prior art crystal structure controlling technologies described with reference to FIGS. 1A, 1B, 2, 3A and 3B in that the products 103/113/125 are different in thermoelectric properties between the p-type thermoelectric material and the n-type thermoelectric material. In detail, it has been known to the persons skilled in the art that the p-type thermoelectric material is superior in thermoelectric properties to the n-type thermoelectric material. When the manufacturer designs the p-type thermoelectric material and the corresponding n-type thermoelectric material to have the Seebeck coefficient equal therebetween, the n-type thermoelectric material obtained through any one of the prior art crystal structure controlling technologies is higher in electric resistivity than the p-type thermoelectric material also obtained through the same prior art crystal structure controlling technology. If the manufacturer designs the p-type thermoelectric material and the corresponding n-type thermoelectric material to have the electric resistivity equal therebetween, the n-type thermoelectric material obtained through any one of the prior art crystal structure controlling technologies is higher in the Seebeck coefficient than the p-type thermoelectric material also obtained through the same prior art crystal structure controlling technology. In fact, the manufacturer thinks it impossible to produce n-type thermoelectric material in the $(Bi, Sb)_2 (Te, Se)_3$ system with the figure of merit greater than $3.00 \times 10^{-3}/K$ through any one of the prior art crystal structure controlling technologies. However, the manufacturer requires the n-type thermoelectric material and the p-type thermoelectric material equal in thermoelectric properties to each other for a thermoelectric module. Especially, the thermoelectric module applicable to an optical communication system requires n-type thermoelectric material equal in electric resistivity to or less than $2 \times 10^{-5}$ Ω·m and greater in figure of merit than $3.0 \times 10^{-3}/K$. However, such a high-performance n-type thermoelectric material is not presently manufactured. Thus, the problem inherent in the prior art thermoelectric material is that both of the n-type thermoelectric material and the p-type thermoelectric material in (Bi, Se)(Te, Se) system can not achieve the figure or merit greater than $3.0 \times 10^{-3}/K$.

The prior art crystal structure controlling technology described with reference to FIGS. 1A and 1B has another problem in dispersion of properties and a low production yield. While the bulk 101 is moving from the wide space to the narrow space, the bulk 101 is squeezed to the rod 103 as shown in FIG. 4A. However, the bulk 101 is not uniformly squeezed. The peripheral portion 130 is strongly squeezed, but the central portion 131 is less squeezed. This phenomenon results in the low production yield. This means that the amount of crystal grains with (001) planes oriented in the certain direction is different between the peripheral portion 130 and the central portion 131. Since the thermal conductivity is dependent on the amount of crystal grains with (001) planes oriented in the certain direction, the central portion 131 is different in thermal conductivity from the central portion 131. If the manufacturer designs the thermal conductivity in the peripheral portion 130 to a target value, the central portion 131 is out of the target range, and, accordingly, is not used for the thermoelectric element. If the rod 103 is thin, only a small amount of the thermoelectric material is available for the thermoelectric element. Furthermore, while the rod 103 is being extruded from the die unit 102, the rod 103 is rotated in the die unit 102. The rotation of the rod 103 results in (001) crystal planes 132 arranged in the direction 133 of the rotation as shown in FIG. 4C. Although crystal grains are in the peripheral portion 130, the crystal grains exhibit different electric resistivity, and a part of the peripheral portion 130 is not available for the thermoelectric elements. Thus, the manufacturer suffers from a low production yield.

Another problem is further encountered in the prior art crystal structure controlling technology described with reference to FIGS. 3A and 3B in high electric resistivity. The ingot of solid solution of the thermoelectric material is pulverized into the powder before the pressure sintering. For this reason, the crystal grains of the sintered product 124 are relatively large and lack of uniformity. Even though the sintered product is subjected to the hot upset forging, the large and non-uniform crystal grains make the thermoelectric semiconductor 125 exhibit a large electric resistivity. In n-type thermoelectric semiconductor material, the large electric resistivity is serious.

SUMMARY OF THE INVENTION

It is therefore an important object of the present invention to provide thermoelectric material, which exhibits a large figure of merit regardless of the conductivity type thereof It is also an important object of the present invention to provide a process for producing the thermoelectric material.

It is another important object of the present invention to provide a thermoelectric module using the thermoelectric material.

In accordance with one aspect of the present invention, there is provided a thermoelectric material composed of at least one element selected from the group consisting of Bi and Sb and at least one element selected from the group consisting of Te and Se, and comprising crystal grains having respective [001] directions and an average grain size equal to or less than 30 microns, certain crystal grains having the [001] directions crossing a direction in which an electric current flows at 45 degrees or less, said certain crystal grains occupying an area equal to or less than 10% on a section perpendicular to the direction.

In accordance with another aspect of the present invention, there is provided a process for producing a thermoelectric material composed of at least one element selected from the group consisting of Bi and Sb and at least one element selected from the group consisting of Te and Se, and the process comprises the steps of a) preparing a fusion of the thermoelectric material, b) rapidly solidifying the fusion so as to obtain flakes of the thermoelectric material, c) stacking the flakes so as to form a lamination, d) putting the lamination into a die having an inlet portion and an outlet portion obliquely extending with respect to the inlet portion and e) pressurizing the lamination for extruding a bulk of the thermoelectric material from the die unit at least once so that a sharing force is exerted on the lamination at a boundary between the inlet portion and the outlet portion.

In accordance with yet another aspect of the present invention, there is provided a process for producing a thermoelectric material composed of at least one element selected from the group consisting of Bi and Sb and at least one element selected from the group consisting of Te and Se, and the process comprises the steps of a) preparing one of an ingot of the thermoelectric material and a powder of the thermoelectric material, b) putting aforesaid one of the ingot and the powder into a die unit having an inlet portion and an outlet portion obliquely extending with respect to the inlet portion and c) pressurizing aforesaid one of the ingot and the powder for extruding a bulk of the thermoelectric material from the die unit at least once so that a shearing force is exerted on aforesaid one of the ingot and the powder at a boundary between the inlet portion and the outlet portion.

In accordance with still another aspect of the present invention, there is provided a thermoelectric module for producing a temperature difference from an electric current passing therethrough, and the thermoelectric module comprises a pair of substrates having respective inner surfaces opposite to each other, conductive layers formed on the inner surfaces and plural thermoelectric elements of a first conductivity type and other thermoelectric elements of a second conductivity type held in contact with the conductive layers so as to be alternately connected in series, each of the thermoelectric elements consists of the plural thermoelectric elements and the other thermoelectric elements including a piece of thermoelectric material and metal layers, the piece of thermoelectric material is composed of at least one element selected from the group consisting of Bi and Sb and at least one element selected from the group consisting of Te and Se, the piece of thermoelectric material comprises crystal grains having respective [001] directions and an average grain size equal to or less than 30 microns, certain crystal grains have the [001] directions crossing a direction in which an electric current flows at 45 degrees or less, and the certain crystal grains occupy an area equal to or less than 10% on a section perpendicular to the direction.

BRIEF DESCRIPTION OF THE DRAWINGS

The features and advantages of the thermoelectric material, the process and the thermoelectric module will be more clearly understood from the following description taken in conjunction with the accompanying drawings in which:

FIGS. 3A and 3B are cross sectional views showing the prior art process for the hot upset forging;

FIG. 4A is a partially cross sectional schematic view showing the rod extruded from the die unit;

FIG. 4B is a bottom view showing the rod;

FIG. 4C is a schematic view showing (001) planes of the crystal grains in the peripheral portion of the rod;

DESCRIPTION OF THE PREFERRED EMBODIMENTS

First Embodiment

Figure 5:
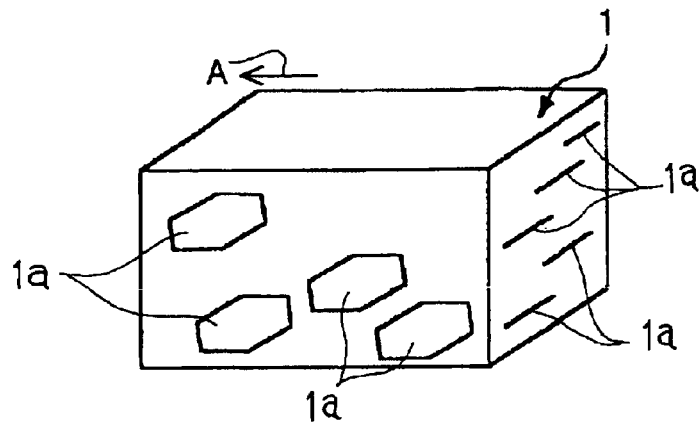
FIG. 5 is a schematic perspective view showing (001) planes of crystal grains in a bulk of thermoelectric material according to the present invention.
Figure 6:
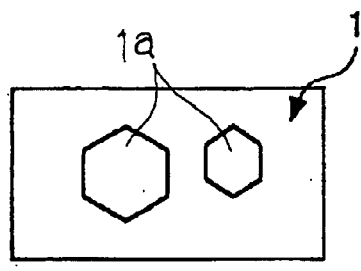
FIG. 6 is a plane view showing the (001) planes of the crystal grains.

Referring to FIGS. 5 and 6 of the drawings, a bulk 1 of thermoelectric material embodying the present invention contains crystal grains, most of which have (001) planes 1a parallel to arrow A. Arrow A is indicative of the direction of electric current flowing in a thermoelectric element containing a piece of the thermoelectric material. The thermoelectric material is composed of at least one element selected from the group consisting of Bi and Sb and at least one element selected from the group consisting of Te and Se. Any halogen is not added to the thermoelectric material.

The bulk of thermoelectric material is obtained through the following process. Fused alloy with the above-described composition is firstly prepared. The fused alloy is solidified through a liquid quenching method. Then, flakes are produced from the fused alloy. The flakes are stacked with one another, and are formed into a lamination.

A die unit is prepared. A passage is formed in the die unit, and a punch is moved into and out of the passage. The passage is broken down into an inlet portion and an outlet portion, which are not coincident with one another. Namely, the inlet portion and the outlet portion have respective centerlines, and the centerline of the inlet portion is oblique with respect to the centerline of the outlet portion.

The lamination is inserted into the inlet portion, and the punch exerts a force on the lamination. The lamination is pressed, and a shearing force is exerted on the lamination at the boundary between the inlet portion and the outlet portion. The bulk 1 is extruded from the outlet portion. The extrusion is carried out once, or is repeated at least once. The direction in which the force is exerted on the lamination is hereinbelow referred to as "pressurization axis", and the direction in which the bulk 1 is extruded from the die unit is referred to as "extrusion axis". The pressurization axis and the extrusion axis are not coincident with one another in the die unit used in the process according to the present invention. The electric current is to flow in the direction substantially parallel to the extrusion axis.

As described hereinbefore, the bulk 1 is produced through the liquid quenching and the extrusion. While the fused alloy is being liquid quenched and while the bulk 1 is extruded from the die unit, distortion takes place in the crystal structure, and serves as carriers. The amount of distortion is controllable by changing the parameters of the liquid quenching such as fusing temperature and a rolling speed as well as the parameters of the extrusion. Thus, the carrier density in the bulk 1 is controlled through the liquid quenching and extrusion without adding any halogen.

The bulk 1 may be obtained through another process. Firstly, an ingot of the above-described composition is prepared. The ingot is pulverized into powder. The powder is supplied to the inlet portion formed in the die unit, and is heated for sintering. The powder is pressed with the punch, and the sharing force is exerted thereon. The bulk 1 is extruded from the outlet portion. The extrusion is carried out once, or is repeated at least once. Thus, the bulk 1 is also obtained through the extrusion. The ingot per se may be supplied into the inlet portion without the pulverization.

The bulk 1 has a large amount of crystal grains which respectively have (001) planes, i.e., c-planes oriented in the predetermined direction. The [001] direction, i.e., c-axis of each crystal grain is perpendicular to the direction indicated by arrow A. For this reason, the bulk 1 of the thermoelectric material is drastically reduced in electric resistivity. When the bulk 1 is produced from the lamination obtained through the liquid quenching method, the crystal grains are extremely fine and homogeneous. This results in a large Seebeck coefficient. The thermoelectric material implementing the first embodiment does not contain any halogen. However, the fused alloy may contain one or more than one element selected from the group consisting of I, Cl, Hg, Br, Ag and Cu. SbI is, by way of example, added to Bi, Te and Se at 0.1% by mass. $HgBr_2$ may be added to Bi, Sb, Te and Se at 0.09% by mass. When I, Cl, Hg, Br. Ag and/or Cu is added to the alloy, the carrier concentration in the thermoelectric material is well controlled so as to enhance the Seebeck coefficient.

The fused alloy is, by way of example, produced as follows. Powder of each of the elements is prepared. These kinds powder are blended in the stoichiometric ratio. The mixture is put into a quartz tube, and the air is evacuated from the quartz tube. The mixture is sealed in the quartz tube. The mixture is heated so as to be fused. The fused alloy is agitated in the quartz tube, and is finally solidified. Then, an ingot is obtained. A piece of alloy is separated from the ingot, and is melted for producing the fused alloy.

A twin roll method, single roll method, gas-atomizing method and rotating disk method are examples of the liquid quenching method. Any one of the methods is employable. Homogeneous flakes and powder of the thermoelectric material in $Bi_2Te_3$ system is obtained through the liquid quenching method.

The thermoelectric material thus produced through the above-described process has fine crystal grains. The average grain size is equal to or less than 30 microns. An inclination is defined as "angle between the [001] direction and the extrusion axis". The crystal grains with the inclination equal to or less than 45 degrees are determined on a surface cut in perpendicular to the extrusion axis by using an electron back scattering pattern. In detail, a sample of thermoelectric material is cut along a target surface, and the exposed surface is polished so as to create a smooth surface. While the smooth surface is being scanned by a scanning electron microscope, the distance or angle between the crossing points on the diffraction surface, which is observed with respect to the crystal structure, is measured, and the direction of the planes exposed to the smooth surface is determined on the basis of the distance or angle.

The present inventors investigated the bulk 1 of thermoelectric material through the electron back scattering pattern. The present inventors confirmed that the bulk 1 contained the crystal grains with the inclination equal to or less than 45 degrees which occupied an area not greater than 10% of the total area of the surface. In other words, most of the crystal grains had (001) planes in parallel to the extrusion axis or crossing the extrusion axis at angle less than 45 degrees. The thermoelectric properties of the bulk 1 were improved by virtue of the crystal orientation.

Figure 7:
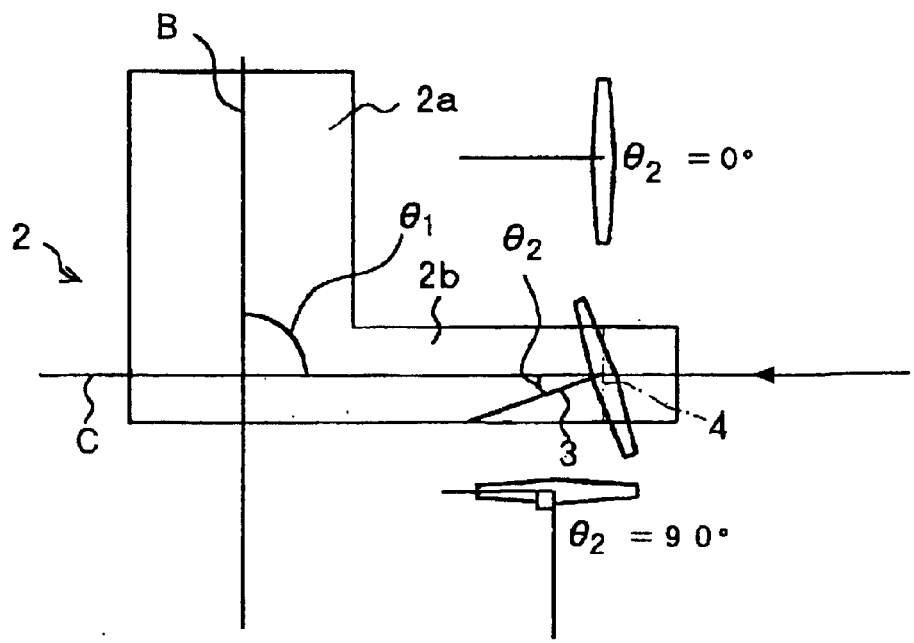
FIG. 7 is a schematic view showing the internal arrangement of a die unit used in a process according to the present invention.

The reason why the crystal grains are preferably oriented is hereinbelow described with reference to FIG. 7 of the drawings. The pressurization axis and the extrusion axis are labeled with "B" and "C", respectively, and references 2a and 2b designate the inlet portion and the outlet portion of the die unit 2, respectively. The outlet portion 2b is narrower in cross section than the inlet portion 2a, and the angle between the inlet portion 2a and the outlet portion 2b is adjusted to 90 degrees.

While a punch (not shown) is exerting a force on the lamination or powder in the inlet portion 2a, the lamination or powder is pressed against the inner surface defining the elbow portion of die unit 2, and the reaction from the inner surface acts as a shearing force exerted on the lamination or powder. As a result, the lamination or powder is extruded from the inlet portion 2a into the outlet portion 2b, and the crystal grains are oriented through the rotation due to the shearing force. When the bulk 1 is extruded from the die unit 2, most of the crystal grains have respective (001) planes substantially in parallel to or close to the extrusion axis C, and the average grain size is equal to or less than 30 microns. [001] direction is labeled with reference numeral 3, and θ2 is indicative of the angle between the [001] direction and the extrusion axis C, i.e., the inclination. The crystal grains with the inclination θ2 equal to or less than 45 degrees occupy an area not greater than 10% of the total area of a surface 4 perpendicular to the extrusion axis C. In other words, most of the crystal grains on the surface 4 have the inclination greater than 45 degrees so that (001) planes thereof are in parallel to the extrusion axis C or cross the extrusion axis C at angle less than 45 degrees.

If the crystal grains with the inclination equal to or less than 45 degrees are increased, the thermoelectric material exhibits the electric resistivity larger than $1.2 \times 10^{-5}$ Ω·m. For this reason, the bulk 1 of the thermoelectric material produced through the process according to the invention achieves the resistivity equal to or less than $1.2 \times 10^{-5}$ Ω·m, because the crystal grains with the inclination equal to or less than 45 degrees occupy the area not greater than 10% of the total area of the perpendicular surface 4.

The crystal orientation was further investigated through an x-ray diffraction method. The x-ray diffractometer used in the investigation employed an x-ray diffraction method called as "2θ/θ method". The crystal orientation on the perpendicular surface 4 was subjected to the x-ray diffraction, and the present inventors analyzed the diffraction profile on the perpendicular surface 4. The diffraction intensity representative of (110) plane was greater than the diffraction intensity representative of (015) plane. (110) planes on the perpendicular surface 4 were conducive to the improvement of the electric properties.

The present inventors prepared a sample of the thermoelectric material. The present inventors defined a surface, which was to be parallel to the extrusion axis and perpendicular to the plane defined by the pressurization axis and the extrusion axis. The present inventors applied the x-ray diffraction method to the surface, and analyzed the diffraction profile on the surface. The diffraction intensity representative of (006) plane was larger than the diffraction intensity representative of (015) plane, and the half value width on the rocking curve obtained from (006) plane was equal to or less than 10°. This feature was also conducive to the improvement of the electric properties.

As will be understood from the foregoing description, the n-type thermoelectric material produced in accordance with the present invention is equivalent in thermoelectric properties to the p-type thermoelectric material. In general, the homogenous crystal orientation is required for n-type thermoelectric material, and the carrier concentration is precisely controlled for enhancing the Seebeck coefficient. Moreover, fine crystal grains are required for reduction in thermal conductivity. The starting material is obtained through the liquid quenching method so that the fine crystal grains and good carrier concentration control are achieved without adding any halogen. The shearing force is exerted on the starting material in the die unit, which has the outlet portion not coincident with the inlet portion. While the shearing force is being exerted on the material, the crystal grains are preferably oriented. This results in the n-type thermoelectric material equivalent in thermoelectric properties to the p-type thermoelectric material.

Second Embodiment

A process implementing the second embodiment proceeds as follows. The process starts with preparation of an ingot of thermoelectric material. The thermoelectric material is composed of at least one element selected from the group consisting of Bi and Sb and at least one element selected from the group consisting of Te and Se. The thermoelectric material is expressed as $(Bi, Sb)_2 (Te, Se)_3$. The ingot is fused, and the fused alloy is subjected to a liquid quenching method, and flakes are produced from the fused alloy. In the flakes, most of the crystal grains have respective (001) planes directed to a certain direction.

A hydrogen reduction and sintering follows the liquid quenching. Thus, a sintered product is obtained through the sintering. A die unit formed with an inlet portion not coincident with an outlet portion is prepared. Any taper is not formed in the passage so that a piece of thermoelectric material is pressurized at only the boundary between the inlet portion and the outlet portion. The sintered product is inserted into the inlet port, and a force is exerted on the sintered product with a punch. The sintered product is pressed against the inner surface at the boundary between the inlet portion and the outlet portion, and the reaction acts as a shearing force. The sintered product is rotated at the boundary, and a bulk of thermoelectric material is extruded from the outlet portion. The extrusion is carried out once, or is repeated at least once. After the extrusion, the thermoelectric material is treated with heat, and the bulk of the thermoelectric material is obtained.

The bulk of thermoelectric material thus produced has a large amount of fine crystal grains, which have respective (001) planes oriented in a predetermined angle range. The average grain size is equal to or less than 30 microns, and the crystal grains, which have respective [001] directions crossing the extrusion axis at 45 degrees or less, occupy an area equal to or less than 10 percent of the cross section perpendicular to the extrusion axis. This results in improvement in electric resistivity. Power factor PF is defined as (Seebeck coefficient/resistivity), i.e., $\alpha/\rho$. The large amount of crystal grains make the power factor PF large. The flakes obtained through the liquid quenching method are so fine and homogeneous that the bulk of thermoelectric material is low in thermal conductivity and high in mechanical strength.

Figures 8A, 8B:
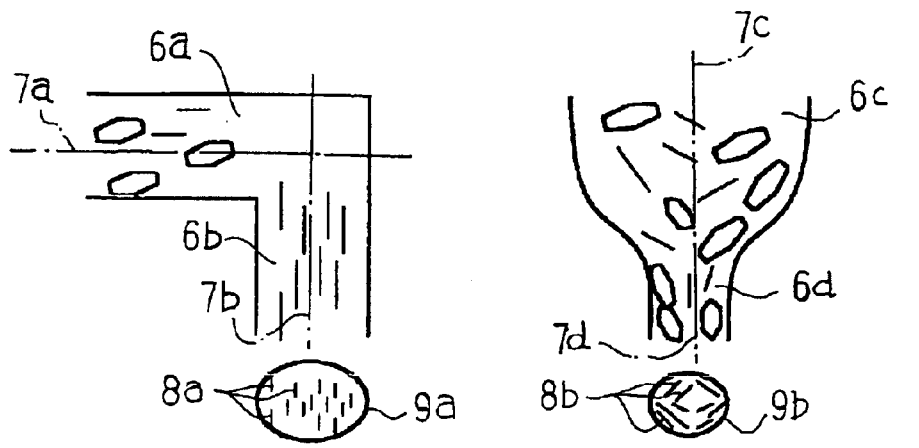
FIGS. 8A and 8B are schematic views showing a difference in extrusion between the process according to the present invention and the prior art process.

One of the particular features of the process according to the present invention is illustrated in FIGS. 8A and 8B. In the process according to the present invention, the die unit is formed with the inlet portion 6a and the outlet portion 6b, and the centerline 7a of the inlet portion 6a crosses the centerline 7b of the outlet portion 6b. The shearing force is exerted on the thermoelectric material at the boundary between the inlet portion 6a and the outlet portion 6b. As a result, the extruded bulk has the crystal grains with (001) planes 8a exposed to a surface 9a perpendicular to the extrusion axis 7b. In the prior art process, the centerline 7c of the inlet portion 6c is coincident with the centerline of the outlet portion 6d, and the crystal grains of the thermoelectric material are oriented during the sliding motion on the inner surface of the die unit. For this reason, [001] direction of each crystal grain is directed to the centerline 7d, and, accordingly, (001) planes 8b are arranged along the direction of the circumference on a surface 9b corresponding to the surface 9a. The crystal grains in the peripheral portion are strongly oriented, because the friction is directly exerted on the peripheral portion. However, the crystal grains in the central portion are less oriented, because the friction has been already consumed in the peripheral portion. Thus, the thermoelectric material produced through the process according to the present invention is more homogenous than the thermoelectric material produced through the prior art process. This results in that the production yield is enhanced by virtue of the process according to the present invention.

Composition Ratio between Te and Se

Figure 9:
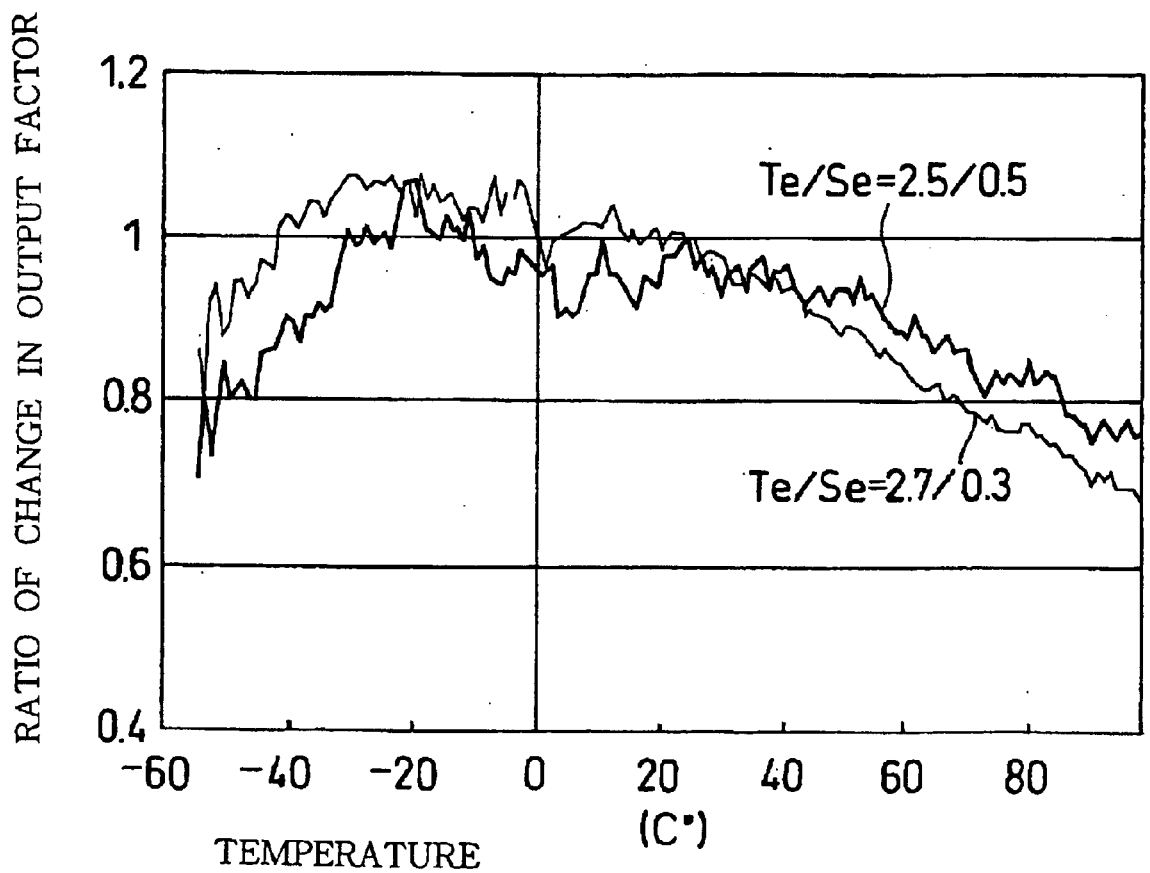
FIG. 9 is a graph showing a relation between the ratio of change in a power factor and temperature.

The present inventors investigated the influence of the composition ratio between Te and Se on the thermal properties. The thermoelectric material is expressed as (Bi, Sb)2 (Te, Se)3. The present inventors produced samples of thermoelectric material different in composition ratio between Te and Se. Using the samples, the present inventors fabricated thermoelectric modules on substrates, and electric current flow through the thermoelectric modules. The present inventors measured the temperature characteristics between –20 degrees to 100 degrees in centigrade, and calculated a ratio of change in power factor. When the thermoelectric modules were operated at room temperature, i.e., 25 degrees in centigrade, the power factor is 1. The ratio of change in power factor was compared among the samples, and the present inventors confirmed that the composition ratio Te/Se between 2.5/0.5 and 2.7/0.3 made the ratio of change in power factor highest as shown in FIG. 9.

Description is hereinbelow made on process parameters for producing the thermoelectric material according to the present invention.

Angle and Temperature

As described hereinbefore, the die unit used for the extrusion has the inlet portion and the outlet portion not coincident with one another, and the shearing force is exerted on the thermoelectric material at the boundary between the inlet portion and the outlet portion. The angle between the pressurization axis and the extrusion axis and the temperature of the thermoelectric material in the extrusion have strong influences on the crystal structure of the thermoelectric material.

The present inventors investigated the influences of these two factors on the crystal structure. The present inventors prepared the die units different in the angle between the pressurization axis and the extrusion axis and plural kinds of thermoelectric material with the composition expressed as (Bi, Sb)2 (Te, Se)3. Any taper was not formed in the passages in the die units. The ratio between Te and Se was within the above-described range. The present inventors extruded bulks of the thermoelectric material from those die units, and observed the crystal structure. The present inventors further evaluated the extruded bulks of the thermoelectric material from the viewpoint of the thermoelectric properties.

The present inventors confirmed that the preferable angle range was between 30 degrees and 150 degrees and that the preferable temperature range was between 300 degrees and 600 degrees in centigrade through the experiments. The angle range between 60 degrees and 120 degrees is more preferable. The present inventors further confirmed that the angle range between 90 degrees and 120 degrees was the most preferable and that the temperature range between 320 degrees and 450 degrees in centigrade was more preferable.

When the angle was less than 30 degrees, the extruded bulks were undesirably deformed. On the other hand, when the angle exceeded 150 degrees, the crystal grains were insufficiently oriented. In case where the temperature was less than 300 degrees in centigrade, the fine crystal grains were hardly obtained in the extruded bodies, and, accordingly, the electric resistivity was undesirably increased. On the other hand, when the extrusion was carried out in the die units higher than 600 degrees in centigrade, the thermoelectric materials tended to be fused, and the extruded bulks were deformed.

Figure 10A:
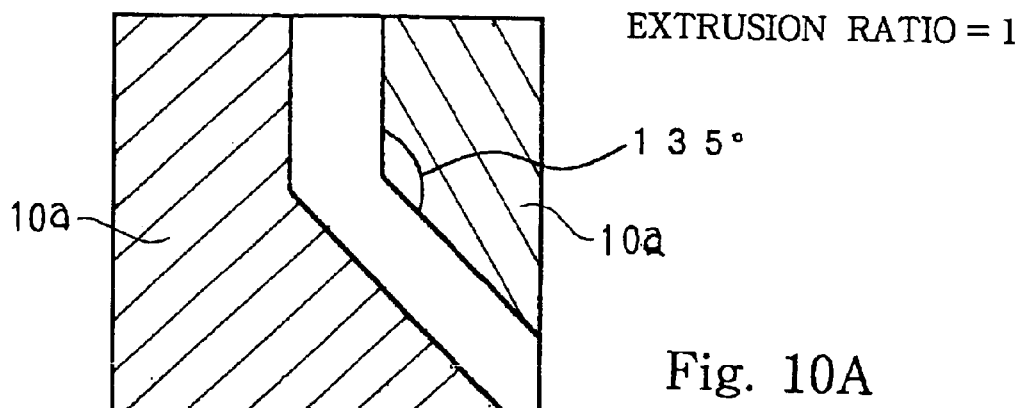
FIGS. 10A and 10B are cross sectional views showing two die units different in extrusion ratio.
Figure 10B:
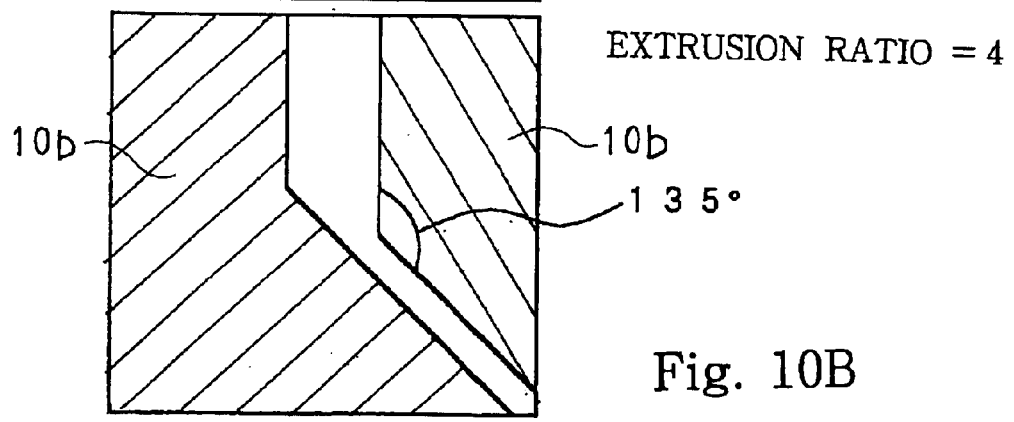

Table 1 shows several experimental results. The thermoelectric material had the composition expressed as $Bi_{1.9}Sb_{0.1}Te_{2.6}Se_{0.4}$. The extrusion ratio was 6.54, and the extruding speed was 0.1 mm/minute. The extrusion ratio is defined as "cross section of the inlet portion/cross section of the outlet portion". Term "grain size" is abbreviated as "GS" in table 1.

ward direction in FIGS. 10A and 10B, and are obliquely extruded from the die units 10a/10b. Inlet portions are open to the upper surfaces of the die units 10a/10b, and outlet portions are open to the side surfaces of the die units 10a/10b. The pressurization axis crosses the extrusion axis at 135 degrees in each of the die unit 10a/10b. The inlet portion is as wide as the outlet portion in the die unit 10a, and the extrusion ratio is 1. However, the other die unit 10b has the wide inlet portion and the narrow outlet portion. The extrusion ratio in the die unit 10b is 4.

The present inventor's extruded bulks of the thermoelectric material from those die units, and calculated the relative density of the extruded bulks. The present inventors concluded that the extrusion ratio was to be equal to or greater than 4.5. In case where the extrusion was repeated, the die unit used in the last extrusion was to have the extrusion ratio equal to or greater than 4.5. This was because of the fact that, when the die unit with a large extrusion ratio was used for a piece of thermoelectric material, the extruded bulk was finer than a bulk of the thermoelectric material extruded

TABLE 1

| | Temperature (degrees in centigrade) | | | | |
|---|---|---|---|---|---|
| | 300 | 350 | 400 | 450 | 500 |
| Angle = 60° | Clogged | GS < 10 μm | GS < 20 μm | GS < 20 μm | GS < 30 μm |
| Figure of Merit ($10^{-3}$ /k) | — | 2.6 | 3 | 3 | 2.8 |
| Angle = 90° | Clogged | GS < 10 μm | GS < 20 μm | GS < 30 μm | GS ≧ 30 μm |
| Figure of Merit ($10^{-3}$ /k) | — | 3.2 | 3.3 | 3.1 | 2.8 |
| Angle = 120° | GS < 10 μm | GS < 10 μm | GS < 20 μm | GS < 30 μm | GS ≧ 30 μm |
| Figure of Merit ($10^{-3}$ /k) | 2.6 | 3.1 | 3.2 | 3 | 2.7 |
| Angle = 150° | GS < 10 μm | GS < 10 μm | GS < 20 μm | GS ≧ 30 μm | GS ≧ 30 μm |
| Figure of Merit ($10^{-3}$ /k) | 2.6 | 2.8 | 2.9 | 2.9 | 2.7 |

The reason why the passage was clogged with the thermoelectric material was that the pressure was increased on the condition that the angle was small. The higher the temperature was, the larger the recrystallized grains were. The large crystal grains were causative of turbulence in the crystal orientation. In case where the temperature exceeded, the thermoelectric material was fused. Thus, the thermoelectric material out of the scope of the present invention was reduced in the figure of merit.

When the bulks of thermoelectric material were extruded under the conditions that the angle was fallen within the range between 90 degrees and 120 degrees and that the temperature was fallen within the range between 320 degrees and 450 degrees in centigrade, the figure of merit was equal to or greater than $3.0 \times 10^{-3}$/K. The experimental data in table 1 supported the angle/temperature ranges. Thus, the above-described angle range and temperature range were more preferable from the viewpoint of the figure of merit.

Extrusion Ratio

The present inventors further investigated influences of the extrusion ratio, the ratio of the area of the inlet portion to the area of the outlet portion on the crystal structure of the thermoelectric material.

The present inventors prepared plural die units different in extrusion ratio from one another. FIGS. 10A and 10B shows two die units different in extrusion ratio. Reference numerals 10a and 10b designate die units different in the angle between the pressurization axis and the extrusion axis. Pieces of thermoelectric material are pressed in the down-from another die unit with a small extrusion ratio. The fine crystal grains were conducive to the improvement in crystal orientation, and enhanced the relative density.

Figure 11:
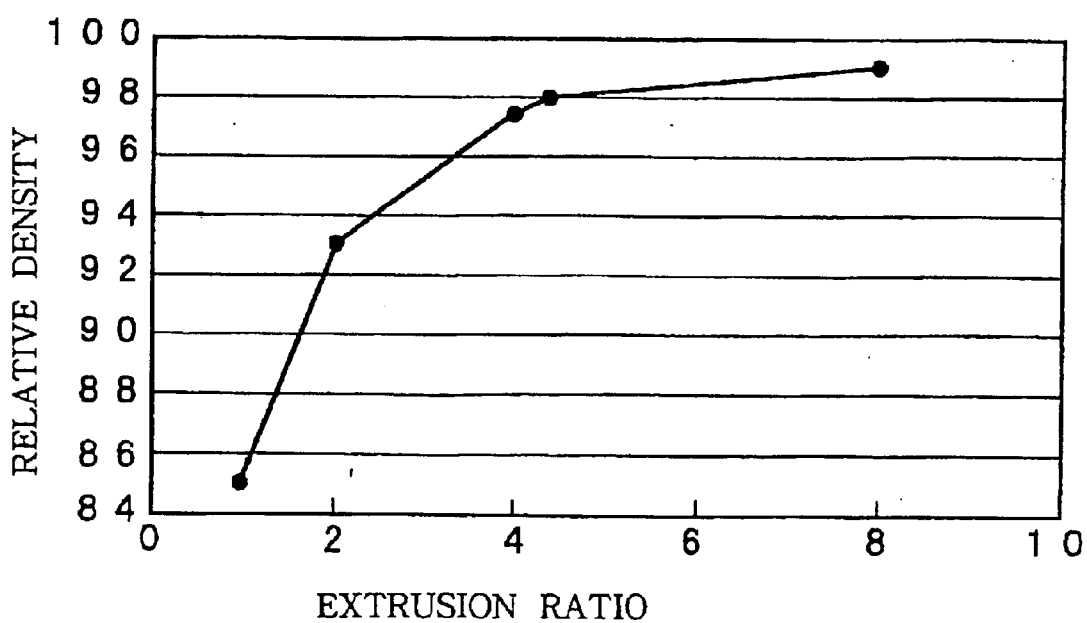
FIG. 11 is a graph showing a relation between a relative density and the extrusion ratio.

The present inventors calculated the relative density of samples formed of $Bi_{1.9}Sb_{0.1}Te_{2.6}Se_{0.4}$, and in FIG. 11 plotted the values in terms of the extrusion ratio. The relative density was representative of the ratio between the density of the sample and the density of a reference sample. The reference sample was the thermoelectric material expressed as $Bi_2Te_3$, which was 7.858 grams/cm$^3$ as written in ASTM (American Society of Testing Method) card. In other words, the relative density of the reference sample was 100%.

The lower the relative density is, the larger the electric resistivity is. From this viewpoint, the thermoelectric material is to be equal in relative density to or greater than 98%. The plots indicated that the relative density exceeded 98% at 4.5. Thus, the experimental data supported the critical extrusion ratio of 4.5.

The present inventors further carried out the experiments. The present inventors extruded bulks of the thermoelectric material through repetition of the extrusion. The present inventors found that the high relative density was achieved by using the die unit with the extrusion ratio equal to or greater than 4.5 in the last extrusion regardless of the die unit or units used in the previous extrusion.

Attitude of Bulk

As described hereinbefore, the extrusion may be repeated at least once. The present inventors investigated the attitude of a bulk of thermoelectric material inserted into the inlet portion of a die unit in the repetition of the extrusion.

Figure 12A:
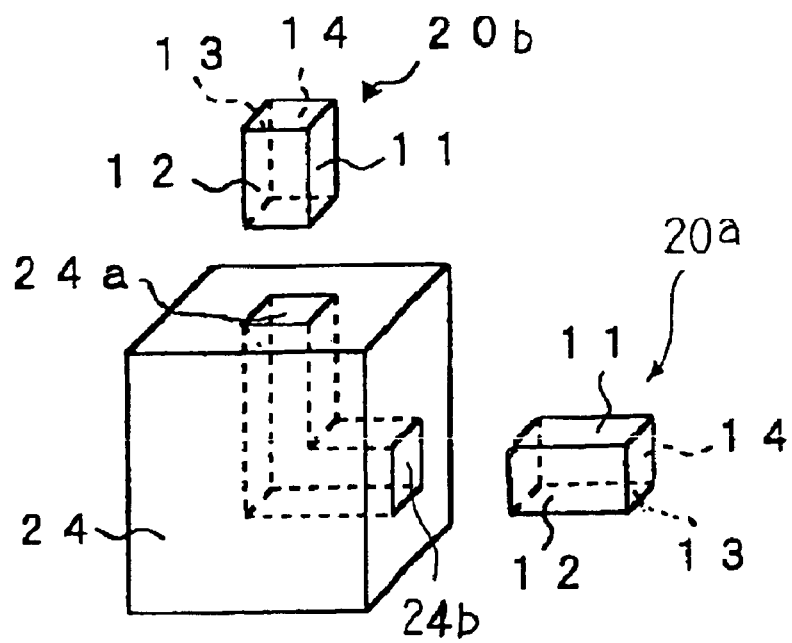
FIGS. 12A and 12B are schematic perspective views showing the attitude of a bulk of thermoelectric material repeatedly extruded from a die unit.
Figure 12B:
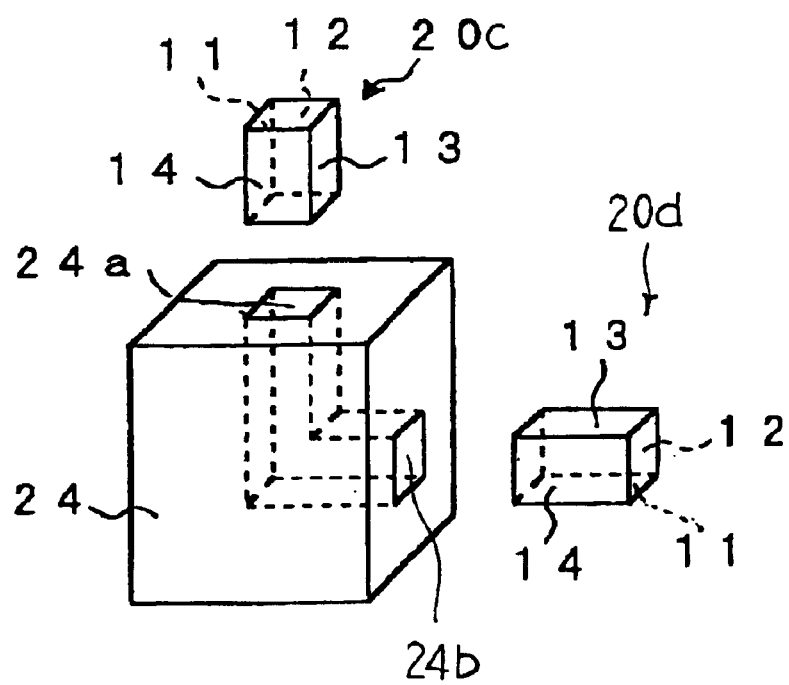

FIGS. 12A and 12B show a bulk 20a/20b/20c/20d of thermoelectric material extruded from a die unit 24 twice. References 24a and 24b designate an entrance of the die unit and an exit from the die unit, respectively. The present inventors changed the attitude of the bulk between the first extrusion and the second extrusion, and evaluated the attitudes from the viewpoint of the grain size and the crystal orientation. The present inventors found it preferable to take the attitudes shown in FIGS. 12A and 12B.

The first preferable attitude was illustrated in FIG. 12A. When the first extrusion was completed, the bulk 20a was taken out from the die unit 24. The bulk 20a had a rectangular parallelepiped shape, and four surfaces 11, 12, 13 and 14 were in parallel to the extrusion axis. The upper surface was labeled with reference numeral 11, the lower surface was labeled with reference numeral 13, and the side surfaces were labeled with reference numerals 12 and 14. The bulk 20a turned at 90 degrees about an axis passing through the side surfaces 12 and 14 and perpendicular to the extrusion axis. Then, the bulk 20a changed the attitude as labeled with reference 20b. The bulk 20b was inserted through the entrance 24a, and was moved in the inlet portion downwardly. The surface 13 slid on the vertical surface farthest from the exit 24b, and the surface 11 slid on another vertical surface closest to the exit 24b. The present inventors confirmed that the crystal grains were strongly oriented without changing the grain size.

Another preferable attitude was illustrated in FIGS. 12A and 12B. The bulk 20b was inserted into the inlet portion through the entrance 24a, and the bulk 20a was extruded from the die unit 24. Thus, the first extrusion was illustrated in FIG. 12A.

The bulk 20a was twisted so as to change the attitude as labeled with reference 20c. Namely, the bulk 20a was rotated about the axis passing through the surfaces 12 and 14 and perpendicular to the extrusion axis, which resulted in the attitude labeled with 20b, and was further rotated about the axis parallel to the pressurization axis over 180 degrees. Then, the bulk had the attitude labeled with 20c. The bulk 20c was inserted into the inlet portion through the entrance 24a, and was downwardly moved in the inlet portion. The surface 11 slid on the farthest vertical surface, and the surface 13 slid on the closest vertical surface. The present inventors confirmed that the crystal grains were strongly oriented without changing the grain size.

Repetition

The present inventors further investigated the influence of repetition on the figure of merit. The present inventors prepared samples formed of the thermoelectric material. The present inventors repeatedly extruded the samples from a die unit. The die unit had the angle between the pressurization axis and the extrusion axis adjusted to 90 degrees, and the extrusion was carried out in argon at 450 degrees in centigrade. The punch was moved at 0.03 millimeter per minute. However, the number of times repeated was different among the samples. The present inventors evaluated the samples from the viewpoint of the figure of merit. The present inventors firstly confirmed that the bulk of thermoelectric material subjected to the extrusion at least once was larger in figure of merit than the bulk of thermoelectric material subjected to the extrusion only once. The present inventors further confirmed that the maximum share shear stress was increased proportional to the number of times repeated and that the average grain size was reduced inversely proportional to the number of times repeated.

Figure 13:
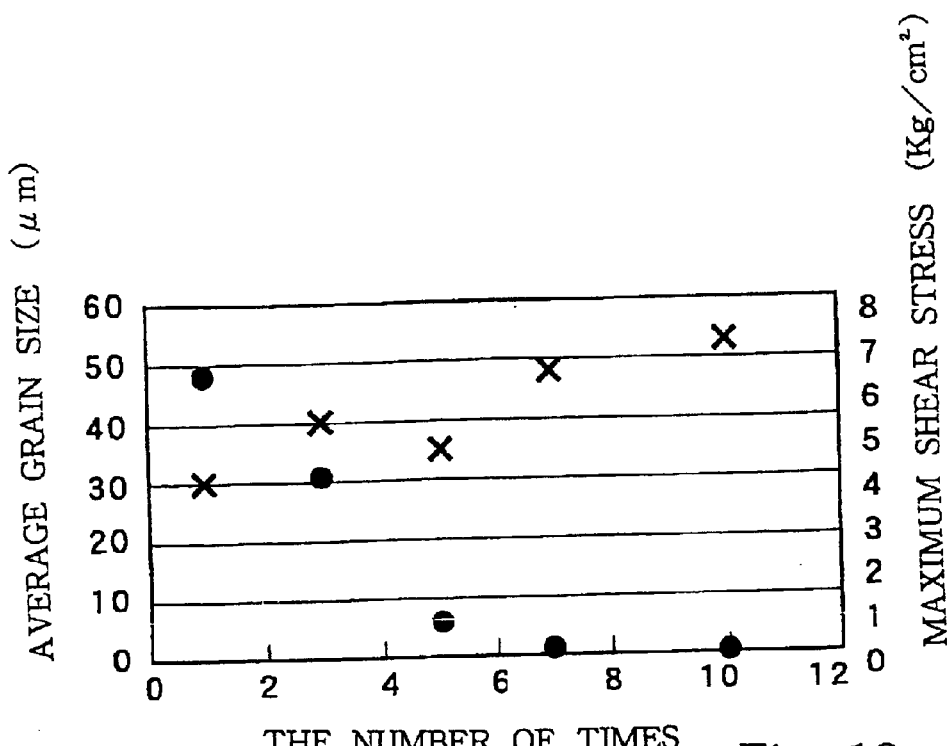
FIG. 13 is a graph showing relations between the number of times repeated and the average grain size of samples and between the number of times repeated and the maximum share stress in the samples.

FIG. 13 shows the relation between the number of times repeated and the average grain size and the relation between the number of times repeated and the maximum share stress. Plots "x" were representative of the relation between the number of times repeated and the maximum shear stress in the samples, and dots stood for the relation between the number of times repeated and the average grain size of the samples. When the number of times was increased, the average grain size was reduced. On the other hand, the maximum shear stress was increased together with the number of times repeated.

Additionally, when the extrusion was repeated at least once, it was preferable that the exit of the die unit used in an extrusion was equal in cross section to the entrance of the die unit used in the next extrusion.

Extrusion Speed

The present inventors further investigated influences of the extrusion speed on the thermoelectric properties. The present inventors prepared samples of the thermoelectric material, and extruded the samples from a die unit in the technical scope of the present invention at different extrusion speed. The present inventors calculated the figure of merit, and found that the extrusion speed was to be fallen within the range from 0.01 millimeter per minute to 1 millimeter per minute. The present inventors further confirmed that the extrusion speed between 0.05 mm/min. and 0.2 mm/min. was more preferable.

When the extrusion speed was less than 0.01 millimeter per minute, the extrusion consumed a long time. Such a low extrusion speed was not preferable from the viewpoint of the productivity. On the other hand, when the extrusion speed exceeded 1 millimeter per minute, a large force was required for the punch, and the density was rather lowered.

Table 2 shows the figure of merit achieved by the samples fallen within the technical scope of the present invention. The samples were extruded from the die unit with the angle adjusted to 90 degrees, and the extrusion was carried out at 450 degrees in centigrade.

TABLE 2

| Extrusion Speed (mm/min.) | Figure of Merit ($\times 10^{-3}$/K) |
| --- | --- |
| 0.005 | 2.8 |
| 0.01 | 3 |
| 0.1 | 3.2 |
| 0.5 | 2.9 |
| 2 | Clogged |

As will be understood, when the extrusion speed was fallen within the range between 0.01 mm/min. and 1 mm/min., the samples exhibited the large figure of merit. The samples subjected to the extrusion at 0.05 mm/min. to 0.2 mm/min. exhibited the figure of merit equal to or greater than $3.0 \times 10^{-3}$/K.

Post Treatment

After the extrusion, the thermoelectric material according to the present invention is subjected to a post treatment in a direction parallel to the extrusion axis on the plane defined by the pressurization axis and the extrusion axis as follows. One of the post treatments is an SPS (Spark Plasma Sintering). Another post treatment is a hot pressing by using a forging machine. The present inventors investigated influences of the post treatment on the thermoelectric properties. The present inventors prepared samples of the thermoelectric material, and divided the samples into three groups. The samples were formed of thermoelectric material expressed as $Bi_{1.9}Sb_{0.1}Te_{2.6}Se_{0.4}$. The samples of the first group were produced from the flakes obtained through the liquid quenching method identical in conditions to those of the second embodiment, and were subjected to the hot pressing without any extrusion. The samples of the second group were produced through the process implementing the second embodiment. The samples of the second group were subjected to the extrusion. The die unit had the inlet portion not coincident with the outlet portion, and the angle between the pressurization axis and the extrusion axis was 90 degrees. The extrusion was carried out at 450 degrees in centigrade at 0.1 mm/min. However, the samples of the second group were not subjected to the hot pressing. The samples of the third group were subjected to the hot pressing after the extrusion. The present inventors measured the electric resistivity, and determined the Seebeck coefficient. The present inventors plotted the thermoelectric properties of the samples in FIG. 14. A bubble circle stood for one of the samples in the first group, triangle was representative of the relation observed in the samples of the second group, and x stood for one of the sample in the third group. Three linear lines represented the power factor P.F. of $3.0 \times 10^{-3}$ W/(K$^2$m), $3.5 \times 10^{-3}$ W/(K$^2$m) and $4.0 \times 10^{-3}$ W/(K$^2$m).

The power factor P.F. is the quotient of the division where the figure of merit, i.e., $Z=\alpha 2/(\rho \times \kappa)$ is divided by thermal conductivity $\kappa$. Thus, the power factor P.F. is one of the thermoelectric properties, and each of the linear lines indicates that the thermoelectric property is constant. The higher the power factor is, the more desirable the thermoelectric material is.

Figure 14:
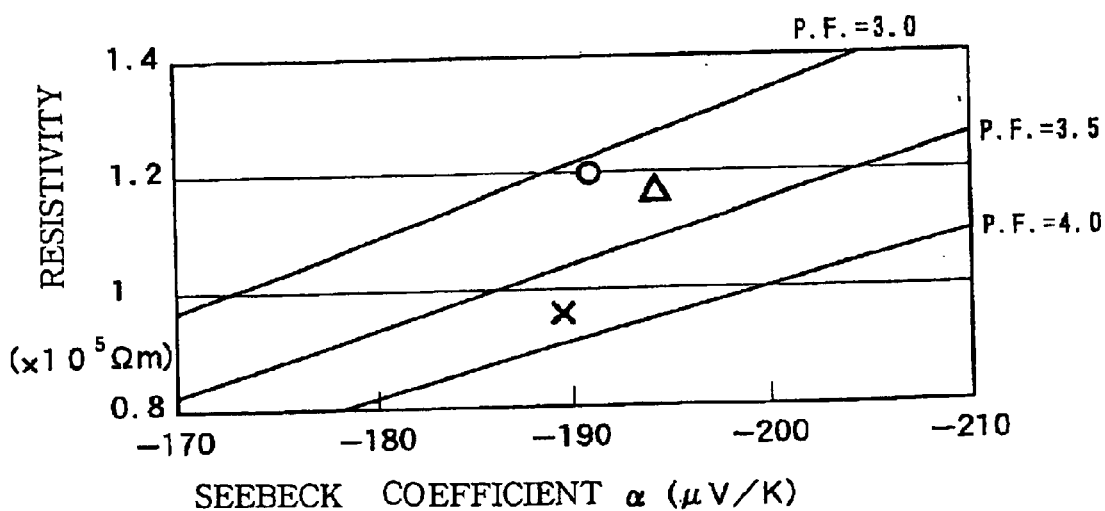
FIG. 14 is a graph showing a relation between the Seebeck coefficient and electric resistivity measured in samples differently treated.

From FIG. 14, the samples of the first group were large in both of the Seebeck coefficient and the electric resistivity, because the crystal grains were not strongly oriented through the hot pressing. As a result, the power factor P.F. was close to the linear line representing $3.0 \times 10^{-3}$ W/(K$^2$m). The samples of the second group and the samples of the third group were subjected to the extrusion, and the electric resistivity was lower than that of the samples of the first group. The samples of the second group were at the middle point between the leaner lines representing $3.0 \times 10^{-3}$ W/(K$^2$m) and $3.5 \times 10^{-3}$ W/(K$^2$m). On the other hand, the samples of the third group were fallen within the range between $3.5 \times 10-3$ W/(K$^2$m) and $4.0 \times 10^{-3}$ W/(K$^2$m). Comparing the triangle with the mark "x", it was understood that the hot pressing after the extrusion was conducive to the improvement of the thermoelectric properties. When the samples were hot pressed in the direction perpendicular to the extrusion axis on the virtual plane defined by the pressurization axis and the extrusion axis, the crystal grains became finer without changing the orientation thereof.

The present inventors investigated influences of the conditions for the hot pressing on the thermoelectric properties. The present inventors prepared samples of the thermoelectric material. The samples were extruded from the die unit, and, thereafter, were hot pressed under the different conditions (see table 3). The relative orientation, relative density and relative figure of merit were calculated for the samples after the hot pressing. The samples before the hot pressing had the reference peak intensity of x-ray diffraction representative of (006), reference density and reference figure of merit, which were 100. The relative orientation, relative density and relative figure of merit were the ratio of the peak intensity of the samples after the hot pressing to the reference peak intensity, the ratio of the density of the samples after the hot pressing to the reference density and the ratio of the figure of merit of the samples after the hot pressing to the reference figure of merit. The relative orientation, relative density and relative figure of merit were varied as shown in table 3.

TABLE 3

| Conditions for Hot Press. | | Properties | | |
|---|---|---|---|---|
| Temperature (° C.) | Time (min.) | Relative Orientation | Relative Density | Relative Figure of Merit |
| 500 | 30 | 92 | 104 | 120.5 |
|  | 60 | 86 | 103 | 123.1 |
|  | 180 | 25 | 104 | 100.2 |
| 450 | 30 | 100 | 105 | 124.2 |
|  | 60 | 95 | 104 | 130.2 |
|  | 180 | 40 | 103 | 105.2 |
| 400 | 30 | 112 | 102 | 109.7 |
|  | 60 | 110 | 103 | 111.3 |
|  | 180 | 93 | 103 | 108.8 |
| 350 | 30 | 123 | 102 | 105.9 |
|  | 60 | 105 | 102 | 100.6 |
|  | 180 | 103 | 102 | 100.2 |

From table 3, it was understood that the density was enhanced through the hot pressing, and, accordingly, the figure of merit was improved.

Preliminary Treatment

The hydrogen reduction is not carried out before the extrusion. In other words, a process without the hydrogen reduction is still in the technical scope of the present invention. However, the hydrogen reduction is preferable, because the flakes are reduced in electric resistivity through the hydrogen reduction.

The present inventors investigated influences of the hydrogen reduction on the thermoelectric properties. The present inventors prepared samples of the thermoelectric material, and divided the samples into two groups. The starting material for all the samples was the flakes produced through the liquid quenching method. The samples of the first group were treated in the hydrogen reduction at 400 degrees in centigrade, and, thereafter, the samples were extruded from the die unit. On the other hand, the samples of the second group were extruded from the die unit without the hydrogen reduction. The hot pressing was not carried out for the samples.

TABLE 4

| Name | Seebeck Coefficient ($\mu$V/K) | Resistivity ($\times 10^{-5}$ $\Omega$m) | Heat Conductivity (W/mK) | Figure of Merit ($\times 10^{-3}$/K) |
|---|---|---|---|---|
| First Group | −193 | 0.967 | 1.24 | 3.11 |
| Second Group | −200.7 | 1.18 | 1.2 | 2.84 |

From table 4, it was understood that the resistivity was reduced by two orders of magnitude by virtue of the hydrogen reduction. The reduction in resistivity resulted in that the figure of merit was increased at 10%.

Lamination

The present inventors further investigated influences of the lamination on the extrusion. Although the lamination of the flakes was not indispensable feature, the flakes were preferable. When the fused alloy was solidified through the twin/single roll method, flakes of the thermoelectric material were easily obtained. The flakes were stacked with one another in such a manner that each flake increased the lamination by its thickness. The inventors confirmed that the use of the lamination resulted in the reduction of force applied with the punch. This phenomenon was derived from the crystal structure of the flakes. (001) planes or c-planes of the crystal grains were arranged in the direction of the thickness of each flake. When the lamination was pressed, c-planes reduced the resistance against the sliding motion.

The present inventors prepared samples of the thermoelectric material. The samples of the first group were shaped in the laminated structure, and the samples of the second group were a corresponding bulk structure. The present inventors extruded the samples from the die unit, and determined a preferable pressure to be applied to the samples of the first group and the samples of the second group.

Figure 15:
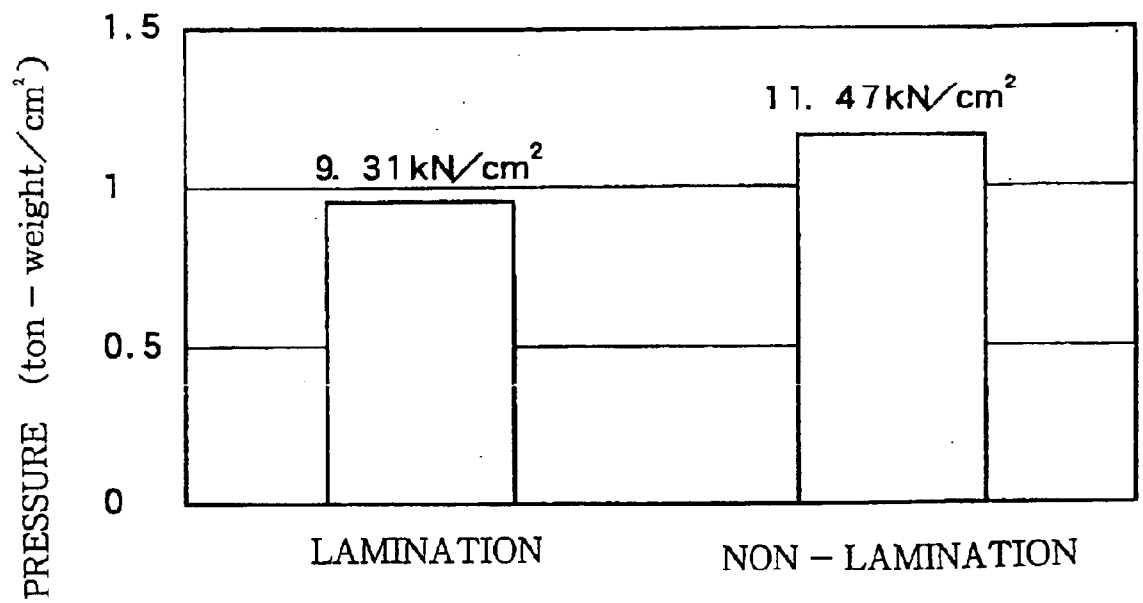
FIG. 15 is a graph showing pressure to be applied to thermoelectric material in an extrusion.

FIG. 15 shows the preferable pressure applied to the samples of the first group and the samples of the second group. The preferable pressure to be applied to the samples of the first group was 9.31 kN/cm$^2$, i.e., 0.95 ton-weight/cm$^2$. The preferable pressure to be applied to the samples of the second group was 11.47 kN/cm$^2$, i.e., 1.17 ton-weight/cm$^2$. Thus, the present inventors confirmed that the lamination was preferable from the viewpoint of reduction in pressure.

Modified Extrusion

Figure 16:
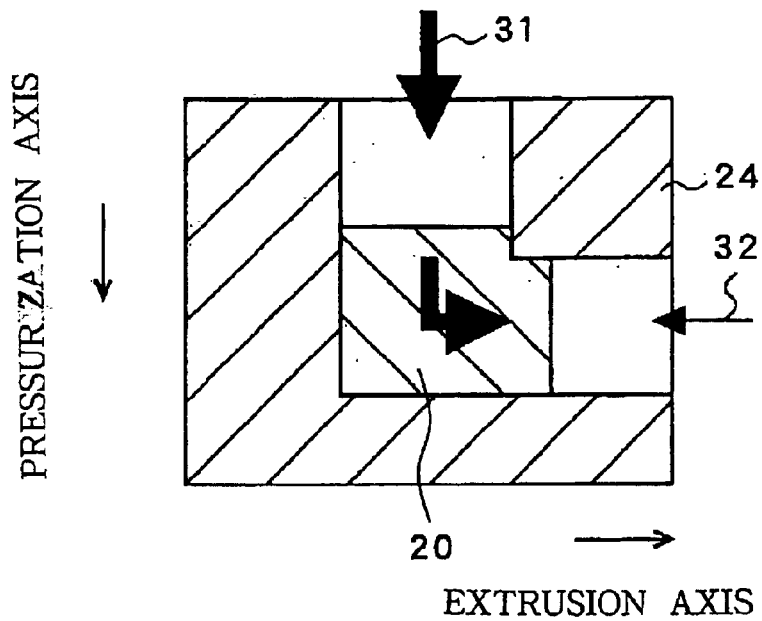
FIG. 16 is a schematic cross sectional view showing a die unit used in a modified process according to the present invention.

The extrusion may be modified as follows. In the above-described extrusion, bulks of thermoelectric material are extruded from the die unit without any resistance. In a modified extrusion employed in the process according to the present invention, a pressure 32 is applied to the extruded body 20 through the exit of the die unit 24 as shown in FIG. 16.

The present inventors investigated influences of the pressure 32 on the thermoelectric properties. The modified extrusion was, by way of example, carried out on the following conditions. The entrance and exit of the die unit 24 were 19.6 cm$^2$ and 4 cm$^2$, respectively. The thermoelectric material had the composition described hereinbefore. The thermoelectric material was pressed against the inner surface at the boundary between the inlet portion and the outlet portion with a punch as indicated by arrow 31, and was pushed out from the exit. The extrusion speed was 0.3 mm/min., and the thermoelectric material 20 was heated to 450 degrees in centigrade. The pressure 32 was applied against the thermoelectric material. The extruded thermoelectric material was observed, and the present inventors confirmed that preferable pressure 32 was 4.9 kN/cm$^2$. When the pressure 32 was regulated to 4.9 kN/cm$^2$, the finest crystal grains were observed in the extruded thermoelectric material, and the crystal orientation was maintained.

Third Embodiment

A process implementing the third embodiment starts with preparation of an ingot of thermoelectric material. The thermoelectric material has the composition expressed as (Bi, Sb)$_2$(Te, Se)$_3$. The ingot is pulverized so as to obtain powder of the thermoelectric material. The powder is subjected to hydrogen reduction, and, thereafter, is sintered. The powder is, by way of example reduced in hydrogen atmosphere at 400 degrees in centigrade. When the ingot is pulverized, the total surface area is drastically increased, and the powder is liable to be oxidized. The oxide is undesirable, because the resistivity is increased. The oxide is reduced in the hydrogen atmosphere. Thus, the hydrogen reduction prevents the thermoelectric material from a large electric resistivity.

The sintered product is put into a die unit which has an inlet portion not coincident with an outlet portion. The sintered product is pressurized in the die unit, and a shearing force is exerted on the sintered product during the extrusion. The extrusion is carried Out once, or is repeated at least once. The extruded body is treated with heat. Then, a bulk of thermoelectric material is obtained through the process implementing the third embodiment. The average grain size is equal to or less than 30 microns, and the crystal grains, which have respective [001] directions crossing the extrusion axis at 45 degrees or less, occupy an area equal to or less than 10 percent of the cross section perpendicular to the extrusion axis.

The ingot may be not pulverized. Namely, the ingot is extruded from the die unit. Neither hydrogen reduction nor sintering is carried out.

When the powder is used, the extrusion is, by way of example, carried out on the following conditions. The pressurization axis crosses the extrusion axis at 90 degrees in the die unit. The powder is pressed in argon atmosphere at 450 degrees in centigrade, and the extrusion speed is 0.03 mm/min.

Thus, the process implementing the third embodiment is different from the process implementing the second embodiment in that the lamination of flakes is replaced with the ingot or the powder obtained through the pulverization on the ingot. The bulk of thermoelectric material exhibits good thermoelectric properties as similar to that produced through the second embodiment. In detail, the bulk of thermoelectric material produced through the process implementing the third embodiment has a large Seebeck coefficient, and a large amount of crystal grains have (001) planes oriented in the predetermined direction. Although the bulk produced through the process implementing the third embodiment is less homogenous than the bulk produced through the process implementing the second embodiment, the process implementing the third embodiment does not include the liquid quenching step, and is much simpler than the process implementing the second embodiment.

Figures 1A, 1B:
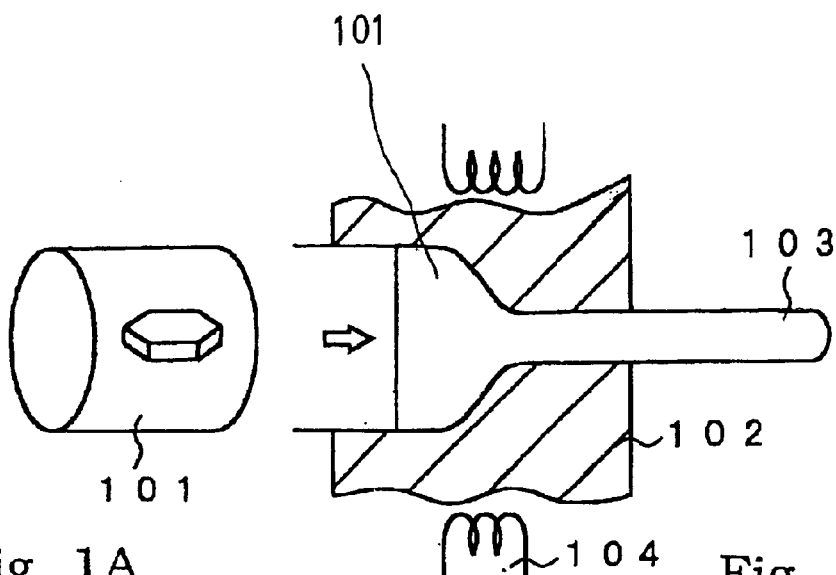
FIGS. 1A and 1B are schematic views showing the prior art extrusion process disclosed in Japanese Patent Application laid-open No. 11-163422.
Figure 2:
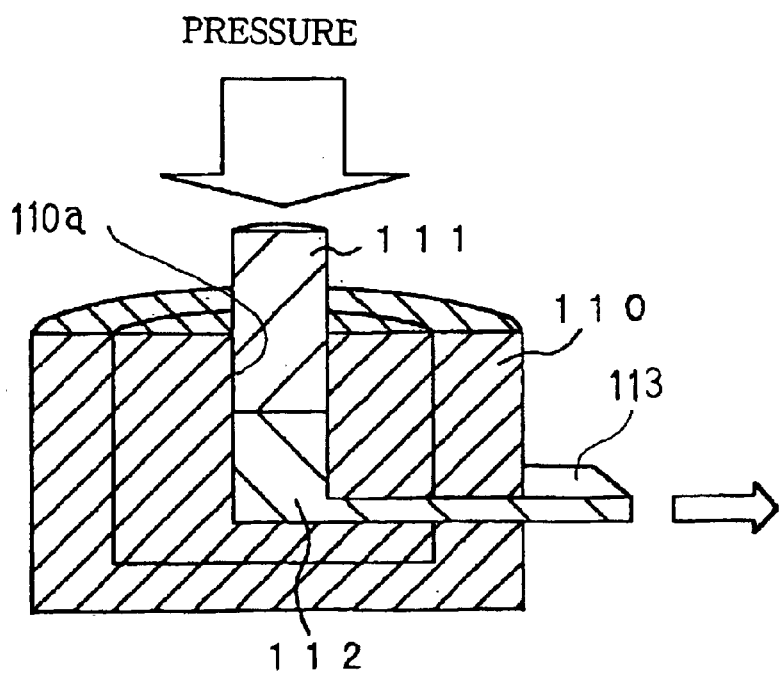
FIG. 2 is a cross sectional schematic views showing the prior art extrusion process disclosed in the proceedings of the spring conference.

Although the bulk produced through the prior art process described in conjunction with FIG. 2 had the average grain size equal to or greater than 50 microns, the bulk produced through the process implementing the third embodiment had the average grain size equal to or less than 30 microns by virtue of the extrusion. Thus, the process implementing the third embodiment was advantageous over the prior art described in reference to FIG. 2.

The process implementing the third embodiment may be modified as similar to that of the second embodiment. The hydrogen reduction may be skipped. A pressure may be applied to the bulk of the thermoelectric material in the direction opposite to the sliding motion in the outlet portion (see FIG. 16).

Thermoelectric Module

Figure 17:
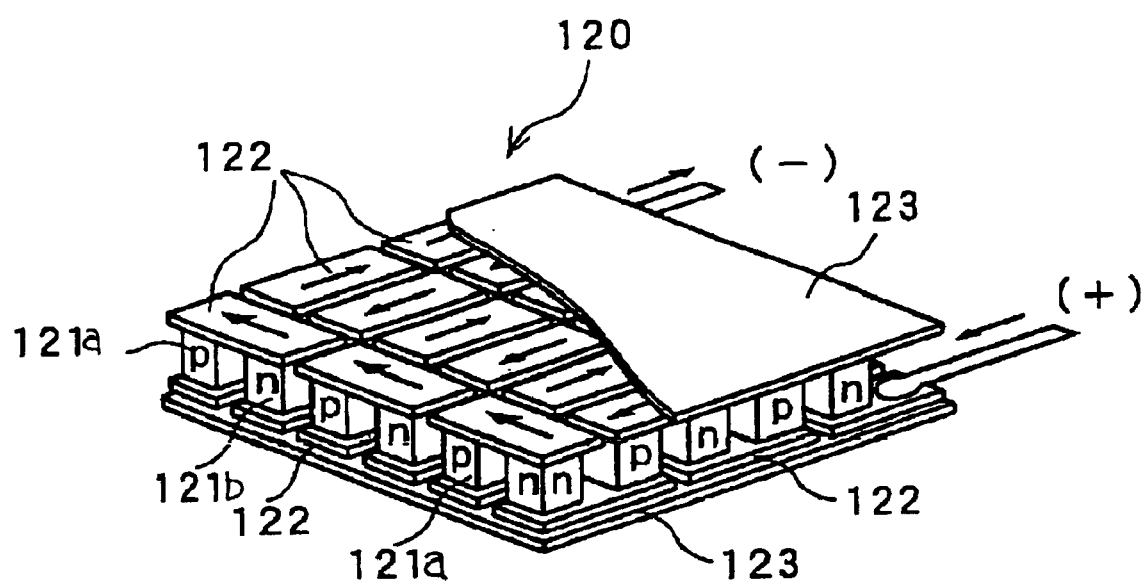
FIG. 17 is a schematic perspective view showing the structure of a Peltier module according to the present invention.

The thermoelectric material produced through the processes described hereinbefore is available for a thermoelectric module such as, for example, a Peltier module. FIG. 17 shows a plain type Peltier module 120 according to the present invention. The plane type Peltier module 120 comprises plural thermoelectric elements 121a/121b and a pair of insulating substrates 123. The insulating substrates 123 are spaced from each other, and a space is created therebetween. The thermoelectric elements 121a/121b occupy the space, and are connected in series through copper electrodes 122. The thermoelectric elements 121a have pieces of p-type thermoelectric material, respectively, and the thermoelectric elements 121b have pieces of n-type thermoelectric material, respectively. The thermoelectric elements 121a are alternated with the thermoelectric elements 121b in the series combination. The n-type thermoelectric material and the p-type thermoelectric material are produced through the process according to the present invention.

Figure 18:
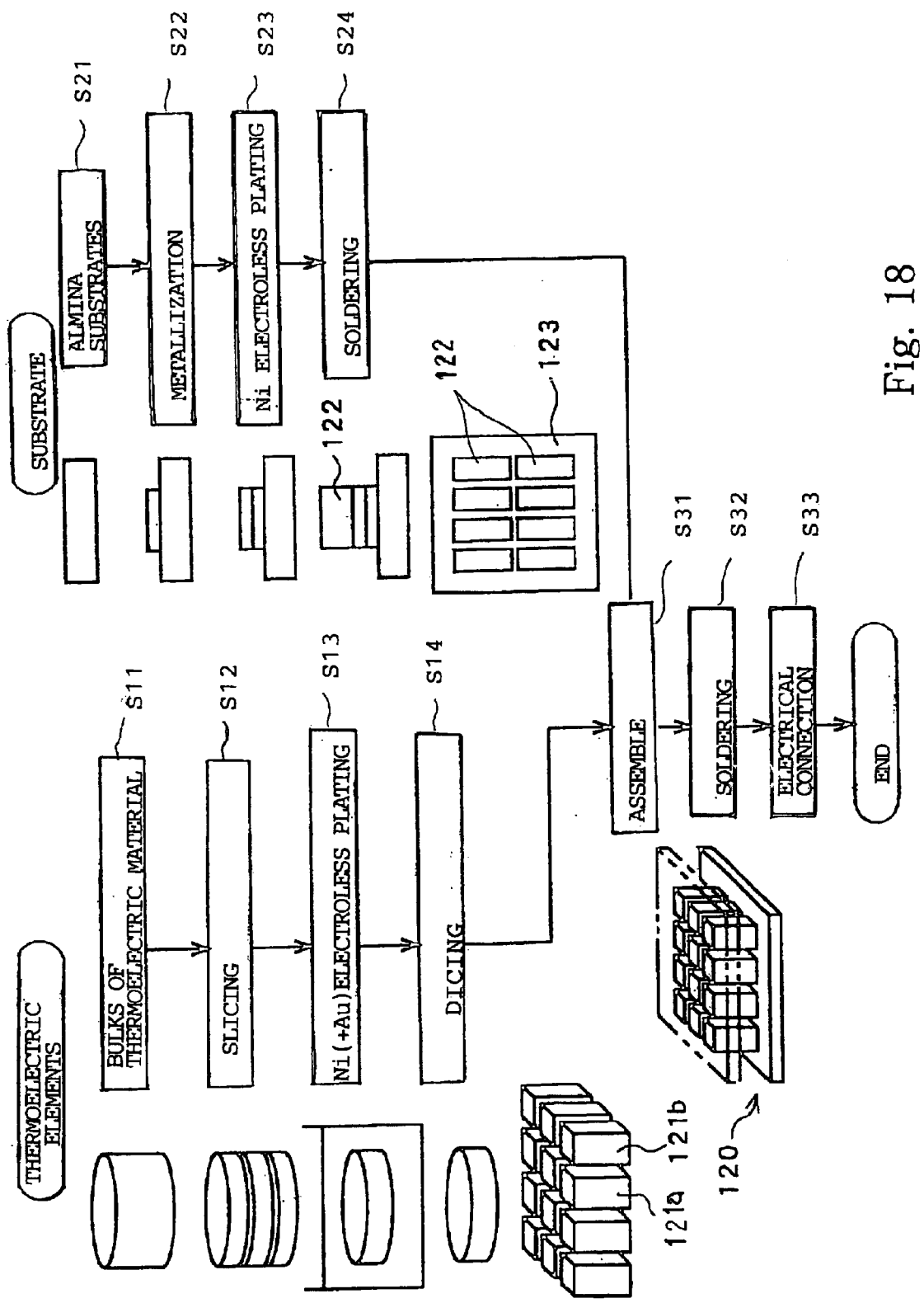
FIG. 18 is a flowchart showing a process for fabricating a thermoelectric module according to the present invention.

The Peltier module 120 is fabricated through a process shown in FIG. 18. Preparation of the thermoelectric elements 121a/121b and preparation of the insulating substrates 123 proceed in parallel in the fabrication process.

The thermoelectric elements 121a/121b are prepared as follows. A bulk of n-type thermoelectric material and a bulk of p-type thermoelectric material are produced through the process implementing any one of the first to third embodiments as by step S11. The bulk of p type thermoelectric material and the bulk of n-type thermoelectric material are sliced as by step S12. Subsequently, nickel is plated on the slices through an electroless plating technique as by step S13. Nickel and gold may be plated through the electroless plating technique. Finally, the slices are separated into dices as by step S14. Thus, the thermoelectric elements 121a/121b are produced through the steps S11, S12, S13 and S14.

On the other hand, the insulating substrates 123 are prepared as follows. First, alumina substrates are produced as by step S21. Subsequently, the alumina substrates are selectively metallized as by step S22, and nickel is placed on the metallized portions of the alumina substrates through an electroless plating technique as by step S23. Finally, the copper electrodes 122 are soldered to the nickel layers as by step S24. Thus, the insulating substrates 123 with the array of copper electrodes 122 are prepared through the steps S21, S22, S23 and S24.

The thermoelectric elements 121a/121b are assembled with the insulating substrates 123 as follows. First, the thermoelectric elements 121a/121b are alternately arranged on the copper electrodes 122 on one of the insulating substrates 123, and are soldered to the copper electrodes 122 as by step S31. Subsequently, the other insulating substrate 123 is provided on the array of thermoelectric elements 121a/121b, and the thermoelectric elements 121a/121b are soldered to the copper electrodes 122 on the other insulating substrates 123 as by step S32. Finally, leads are connected to the first copper electrode 122 and the last copper electrodes of the series combination as by step S33, and the Peltier module 120 is completed.

Figure 19:
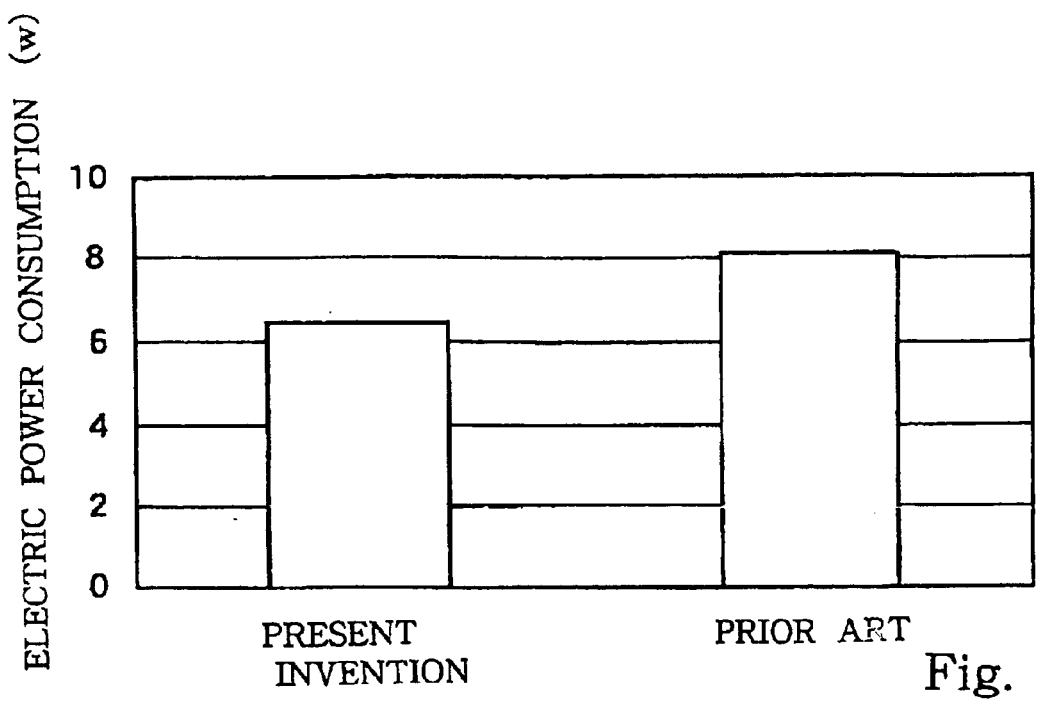
FIG. 19 is a graph showing electric power consumption measured in samples of a Peltier module according to the present invention and the prior art Peltier module.

The present inventor evaluated the Peltier module 120. The present inventors fabricated samples of the Peltier module through the process shown in FIG. 18 and samples of the prior art Peltier module through a corresponding process. The prior art p/n type thermoelectric elements were incorporated in the samples of the prior art Peltier module. The present inventors applied an electric current through the samples of the present invention as well as the samples of the prior art module. Temperature difference was adjusted to a predetermined value. The present inventors measured the electric power consumption. The present inventors confirmed that the electric power consumption was reduced at 20% as shown in FIG. 19.

Samples of Thermoelectric Material

The present inventors produced samples of the n-type thermoelectric material, and confirmed that the processes according to the present invention were available for producing the n-type thermoelectric material.

The present inventors prepared powder of Bi, powder of Sb, powder of Te and powder of Se. The present inventors blended these kinds of powder so as to be regulated to the composition ratio $Bi_{1.9}Sb_{0.1}Te_{2.6}Se_{0.4}$. The resultant mixture was sealed in a quartz tube, and vacuum is developed in the quartz tube. The mixture was heated in vacuum at 680 degrees in centigrade for an hour. The mixture was fused. The fused alloy was well agitated, and was solidified. The resultant bulk was heated to 800 degrees in centigrade, and the fused alloy was rapidly quenched from 800 degrees in centigrade by using the single roll method. The fused alloy was solidified, and flakes were obtained.

The flakes were put into a quartz tube, and were sealed therein together with hydrogen. Thus, the flakes were reduced in the hydrogen atmosphere, and were deoxidized. The flakes were stacked so as to obtain a lamination. The lamination was formed into a pellet by using a cold rolling. Thus, the pellet of $Bi_{1.9}Sb_{0.1}Te_{2.6}Se_{0.4}$ was prepared. Other pellets were similarly prepared. The composition of the other pellets was read from table 5.

Using die units (see table 5), the pellets were subjected to the extrusion. The die unit used for the extrusion on pellet No. 3 has the inlet portion and the outlet portion crossing each other at 90 degrees, and the extrusion ratio was 4.5. The pellet No. 3 was put into the die unit, and was heated to 450 degrees in centigrade. The extrusion was carried out in argon atmosphere, and the extrusion speed was adjusted to 0.1 mm/min.

The pellet No. 9 was same in composition as the pellet No. 3. The same die unit was used for the pellet No. 9. The angle between the pressurization axis and the extrusion axis was adjusted to 90 degrees, and the extrusion ratio was 4.5. The extrusion was carried out in the argon atmosphere at 450 degrees in centigrade, and the extrusion speed was adjusted to 0.1 mm/min. Thus, the pellet No. 9 was subjected to the extrusion on the same conditions for the pellet No. 3. The pellet No. 9 was hot pressed after the extrusion. The force is exerted on the pellet No. 9 in the direction perpendicular to the extrusion axis on the virtual plane defined by the pressurization axis and the extrusion axis. The pressure was 9.8 $kN/cm^2$, and the hot pressing was continued at 450 degrees in centigrade for 90 minutes.

The pellet No. 11 was produced as similar to the pellet No. 3. However, a different die unit was used for the pellet No. 11. The extrusion ratio was 1, and the angle between the pressurization axis and the extrusion axis was adjusted to 120 degrees. The extrusion was carried out in argon atmosphere at 450 degrees in centigrade, and the extrusion speed was adjusted to 0.1 mm/min. The extrusion was repeated four times. Thereafter, the die unit was replaced with the die unit used for the pellet No. 3. The next die unit had the extrusion ratio of 4.5, and the inlet port crossed the outlet port at 90 degrees. The last extrusion was carried out in the argon atmosphere at 380 degrees in centigrade, and the extrusion speed was adjusted to 0.1 mm/min.

The present inventors produced comparative samples. Pellet No. 11 and pellet No. 12 were comparative samples. These pellets were subjected to hot pressing instead of the extrusion. For this reason, any shearing force was not exerted on those pellets.

Table 5 shows the composition of the pellets and the conditions in the process. When the extrusion was repeated at least once, table 5 shows the extrusion ratio in the last extrusion. Pellet Nos. 1 to 10 were fallen within the technical scope of the present invention, and pellet Nos. 11 and 12 were comparative samples. In table 5, abbreviations "AG", "TM", "RT", "TP" and "SP" stand for the angle between the pressurization axis and the extrusion axis, the number of times repeated, the extrusion ratio, the temperature during the extrusion and the extrusion speed.

TABLE 5

| No. | Composition | AG (°) | TM | RT | TP (° C.) | SP (mm/min.) | Hot Press |
|---|---|---|---|---|---|---|---|
| 1 | $Bi_{1.9}Sb_{0.1}Te_{2.5}Se_{0.5}$ | 90 | 1 | 4.5 | 450 | 0.1 | No |

TABLE 5-continued

| No. | Composition | AG (°) | TM | RT | TP (° C.) | SP (mm/ min.) | Hot Press |
|---|---|---|---|---|---|---|---|
| 2 | $Bi_{1.9}Sb_{0.1}Te_{2.6}Se_{0.4}$ | 90 | 1 | 4.5 | 450 | 0.1 | No |
| 3 | $Bi_{1.9}Sb_{0.1}Te_{2.7}Se_{0.3}$ | 90 | 1 | 4.5 | 450 | 0.1 | No |
| 4 | $Bi_{1.9}Sb_{0.1}Te_3$ | 90 | 1 | 4.5 | 450 | 0.1 | No |
| 5 | $Bi_{1.9}Sb_{0.1}Te_{2.6}Se_{0.4}$ | 120 | 1 | 4.5 | 450 | 0.1 | No |
| 6 | $Bi_{1.9}Sb_{0.1}Te_{2.6}Se_{0.4}$ | 160 | 1 | 4.5 | 450 | 0.1 | No |
| 7 | $Bi_{1.9}Sb_{0.1}Te_{2.6}Se_{0.4}$ | 90 | 1 | 4.5 | 450 | 0.1 | Yes |
| 8 | $Bi_{1.9}Sb_{0.1}Te_{2.6}Se_{0.4}$ | 120 | 5 | 4.5 | 450 | 0.1 | No |
| 9 | $Bi_{1.9}Sb_{0.1}Te_{2.6}Se_{0.4}$ | 90 | 1 | 1.96 | 380 | 0.1 | No |
| 10 | $Bi_2Te_{2.6}Se_{0.4}$ | 90 | 1 | 1.96 | 380 | 0.1 | No |
| 11 | $Bi_{1.9}Sb_{0.1}Te_{2.6}Se_{0.4}$ | — | — | — | — | — | Yes |
| 12 | $Bi_{1.9}Sb_{0.1}Te_{2.6}Se_{0.4}$ | — | — | — | — | — | Yes |

The present inventors evaluated the pellets. The Seebeck coefficient a, electric resistivity p and thermal conductivity κ were measured, and the figure of merit was calculated therefrom. The present inventors further measured the crystal grains with [001] direction, i.e., c-axis inclined to the extrusion axis by 45 degrees or less through the EBSP (Electronic Back-Scatter Pattern), and determined the ratio of the area occupied by the crystal grains to the total area of a cross section perpendicular to the extrusion axis. The present inventors further analyzed the cross section perpendicular to the extrusion axis through the x-ray diffraction, and determined the ratio between diffraction intensity I(100) representative of (110) plane to the diffraction intensity I(015) representative of (015) plane, i.e., I(110)/I(015). The results were summarized in table 6. In table 6, "Seebeck" means Seebeck Coefficient, abbreviations "R", "OF", "TC", "FM", "R1" and "R2" stand for the resistivity, the power factor, the thermal conductivity, the figure of merit, the ratio I(110)/I(015) and the ratio of the area occupied by the crystal grains to the total area of the cross section.

TABLE 6

| No. | Seebeck ($\mu$V/K) | R (× $10^{-5}$ $\Omega$m) | OF ($10^{-3}$W/ $K^2$m) | TC (W/mK) | FM ($10^{-3}$/K) | R1 | R2 (%) |
|---|---|---|---|---|---|---|---|
| 1 | −212 | 1.40 | 3.21 | 1.07 | 3.00 | 1.2 | 7.2 |
| 2 | −192 | 1.05 | 3.51 | 1.15 | 3.05 | 1.4 | 7.5 |
| 3 | −188 | 1.01 | 3.50 | 1.11 | 3.15 | 1.4 | 8 |
| 4 | −192 | 1.04 | 3.54 | 1.25 | 2.84 | 1.5 | 4 |
| 5 | −194 | 1.08 | 3.48 | 1.16 | 3.00 | 1.3 | 9.3 |
| 6 | −192 | 1.15 | 3.21 | 1.2 | 2.67 | 1.1 | 12 |
| 7 | −189 | 0.90 | 3.97 | 1.17 | 3.39 | 1.3 | 6.2 |
| 8 | −190 | 0.96 | 3.76 | 1.2 | 3.13 | 1.5 | 6.7 |
| 9 | −203 | 1.35 | 3.05 | 1.2 | 2.54 | 1.3 | 9.3 |
| 10 | −194 | 1.12 | 3.36 | 1.2 | 2.80 | 1.4 | 7.3 |
| 11 | −194 | 1.22 | 3.08 | 1.12 | 2.75 | 0.7 | 25 |
| 12 | −194 | 1.15 | 3.27 | 1.16 | 2.82 | 0.8 | 18 |

Sample Nos. 1 to 10 exhibited good thermoelectric properties. Especially, sample Nos. 1 to 5 were extruded from the die unit with the angle ranging between 90 degrees to 120 degrees, and the thermoelectric properties of these samples were better than those of the other samples. Sample Nos. 2, 8 and 10 had the composition ratio Te/Se fallen within the range between 2.6/0.4 and 3.0/0, and exhibited low electric resistivity equal to or less than $1.2 \times 10^{-5}$ $\Omega$m. Sample No. 7 was hot pressed after the extrusion, and the figure of merit was larger than that of sample No. 2, which was not hot pressed after the extrusion. Sample No. 8 was extruded five times, and exhibited the figure of merit larger than that of sample No. 5 which was extruded once. Since sample No. 6 was extruded from the die unit with the large angle between the pressurization axis and the extrusion axis, the crystal grains were insufficiently oriented, and, accordingly, the ratio R2 exceeded 10%. This resulted in a relatively low figure of merit. Sample No. 9 was extruded from the die with the small extrusion ratio, i.e., 1.96, the figure of merit was relatively small. However, sample Nos. 11 and 12 merely achieved a small figure of merit. The reason why sample No. 11 exhibited the small figure of merit was that the electric resistivity exceeds $1.2 \times 10^{-5}$ $\Omega$m. Although the resistivity was relatively low, sample No. 12 exhibited the small figure of merit. The small figure of merit was derived from the large ratio R2.

The present inventors further investigated a dispersion of crystal orientation on a cross section perpendicular to the extrusion axis. The present inventors measured the orientation of the crystal grains exposed to the cross section, and plotted the ratio of area occupied by crystal grains oriented in a certain direction to the total area of the cross section.

Figure 20:
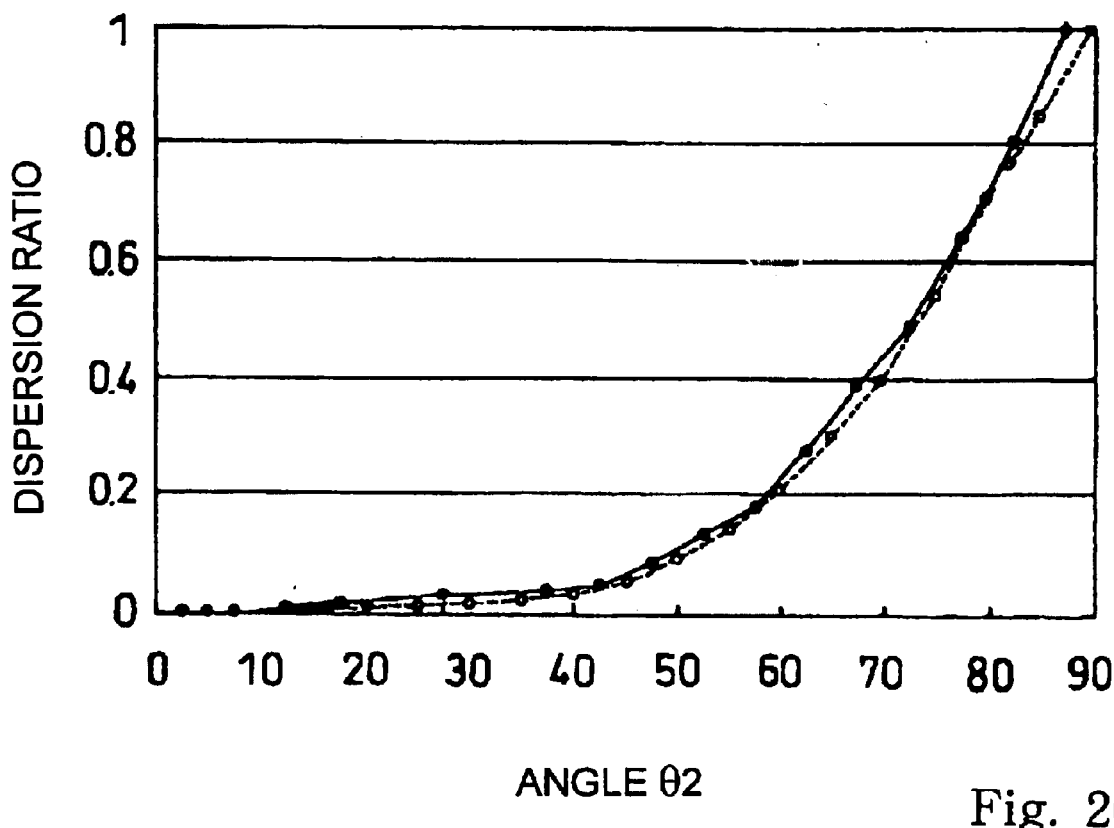
FIG. 20 is a graph showing a relation between a dispersion ratio and the angle between [001] direction and the extrusion axis.

FIG. 20 shows a relation between the dispersion ratio and the angle θ2 between [001] direction and the extrusion axis. Dots stood for sample No. 2. Circles were representative of another sample which was produced under the same conditions except for the temperature during the extrusion. Although sample No. 2 was extruded at 450 degrees in centigrade, the other sample was extruded at 380 degrees in centigrade.

From FIG. 20, it was understood that the total amount of crystal grains with the angle θ2 equal to or less than 45 degrees was a little.

As will be appreciated from the foregoing description, the thermoelectric material according to the present invention contains a large amount of crystal grains (001) planes of which are oriented to a predetermined direction. This crystal structure causes the thermoelectric material to exhibit a small electric resistivity. For this reason, a large figure of merit is achieved by the thermoelectric material according to the present invention.

The process for producing thermoelectric material includes the step for the liquid quenching and the step for the extrusion by using the die unit with the bent passage. The thermoelectric material produced through the process according to the present invention contains the fine crystal grains, and most of the crystal grains are strongly oriented in the predetermined direction. Thus, the thermoelectric material with a large figure of merit is produced through the process according to the present invention.

The p-type thermoelectric material and the n-type thermoelectric material and the metal form the p-type thermoelectric elements and the n-type thermoelectric elements, and the p-type thermoelectric elements and the n-type thermoelectric elements are alternately connected in series on the insulating substrates. The p-type/n-type thermoelectric material is large in figure of merit so that the power consumption of the thermoelectric module is surely reduced.

Although particular embodiments of the present invention have been shown and described, it will be apparent to those skilled in the art that various changes and modifications may be made without departing from the spirit and scope of the present invention.

What is claimed is:

1. A thermoelectric material composed of at least one element selected from the group consisting of Bi and Sb and at least one element selected from the group consisting of Te and Se, and comprising crystal grains having respective [001] directions and an average grain size equal to or less than 30 microns, certain crystal grains having the [001] directions crossing a direction in which an electric current flows at 45 degrees or less, said certain crystal grains occupying an area equal to or less than 10% on a section perpendicular to said direction, said thermoelectric material having a density equal to or greater than 98% with respect to the density of $Bi_2Te_3$ said thermoelectric material having crystal grains with (001) crystal planes substantially parallel to said direction at a certain ratio, said grain size and said density so as to render the figure of merit equal to or greater than $3.0 \times 10^{-3}$/K.

2. The thermoelectric material as set forth in claim 1, in which said thermoelectric material contains at least one element selected from the group consisting of I, Cl, Hg, Br, Ag and Cu.

3. The thermoelectric material as set forth in claim 1, in which the electron serves as the major carrier therein.

4. The thermoelectric material as set forth in claim 1, in which a piece of said thermoelectric material has a cross section perpendicular to said direction and equal to or greater than 4 cm².

5. A process for producing a thermoelectric material composed of at least one element selected from the group consisting of Bi and Sb and at least one element selected from the group consisting of Te and Se, the process comprising:
   a) preparing a fusion of said thermoelectric material;
   b) rapidly solidifying said fusion so as to obtain flakes of said thermoelectric material;
   c) stacking said flakes so as to form a lamination;
   d) putting said lamination into a die unit having an inlet portion and an outlet portion obliquely extending with respect to said inlet portion; and
   e) pressurizing said lamination for extruding a bulk of said thermoelectric material from said die unit at least once so that a shearing force is exerted on said lamination at a boundary between said inlet portion and said outlet portion.

6. The process as set forth in claim 5, in which said an angle between said inlet portion and said outlet portion ranges from 30 degrees to 150 degrees.

7. The process as set forth in claim 5, which an angle between said inlet portion and said outlet portion ranges from 90 degrees to 120 degrees.

8. The process as set forth in claim 5, in which said lamination is heated to 300–600 degrees in centigrade in said step e).

9. The process as set forth in claim 5, in which said lamination is heated to 320–450 degrees in centigrade in said step e).

10. The process as set forth in claim 5, in which an angle between said inlet portion and said outlet portion ranges from 30 degrees to 150 degrees, and said lamination is heated to 300–600 degrees in centigrade.

11. The process as set forth in claim 5, in which an angle between said inlet portion and said outlet portion ranges from 90 degrees to 120 degrees, and said lamination is heated to 320–450 degrees in centigrade.

12. The process as set forth in claim 5, in which said thermoelectric material has a ratio of Te to Se falling within the range between 2.5/0.5 and 2.7/0.3.

13. The process as set forth in claim 5, in which said thermoelectric material has a ratio of Te to Se falling within the range between 2.5/0.5 and 2.7/0.3, an angle between said inlet portion and said outlet portion ranging from 30 degrees to 150 degrees, and said lamination is heated to 300–600 degrees in centigrade.

14. The process as set forth in claim 5, in which said thermoelectric material has a ratio of Te to Se falling within the range between 2.5/0.5 and 2.7/0.3, an angle between said inlet portion and said outlet portion ranging from 90 degrees to 120 degrees, and said lamination is heated to 320–450 degrees in centigrade.

15. The process as set forth in claim 5, in which a cross sectional area of said inlet portion is at least 4.5 times wider than an across sectional area of said outlet portion.

16. The process as set forth in claim 5, in which a cross sectional area of said inlet portion is at least 4.5 times wider than a cross sectional area of said outlet portion, said thermoelectric material has a ratio of Te to Sc fallen within the range between 2.5/0.5 and 2.7/0.3, an angle between said inlet portion and said outlet portion ranges from 30 degrees to 150 degrees, and said lamination is heated to 300–600 degrees in centigrade.

17. The process as set forth in claim 5, in which a cross sectional area of said inlet portion is at least 4.5 times wider than a cross sectional area of said outlet portion, said thermoelectric material has a ratio of Te to Se fallen falling within the range between 2.5/0.5 and 2.7/0.3, an angle between said inlet portion and said outlet portion ranges from 90 degrees to 120 degrees, and said lamination is heated to 320–450 degrees in centigrade.

18. The process as set forth in claim 5, in which said bulk of said thermoelectric material is extruded from said die unit at 0.01–1 mm/min in said step e).

19. The process as set forth in claim 5, in which said bulk of said thermoelectric material is extruded from said die unit at 0.05–0.2 mm/min.

20. The process as set forth in claim 5, in which said steps d) and e) are repeated at least once.

21. The process as set forth in claim 5, further comprising
   f) sintering said bulk of said thermoelectric material with the assistance of plasma in an inert atmosphere.

22. The process as set forth in claim 5, further comprising
   f) pressurizing said bulk of said thermoelectric material in a direction perpendicular to a centerline of said outlet portion on a virtual plane defined by said centerline and a centerline of said inlet portion for a hot pressing.

23. A process for producing a thermoelectric material composed of at least one element selected from the group consisting of Bi and Sb and at least one element selected from the group consisting of Te and Se, the process comprising:
   a) preparing an ingot of said thermoelectric material;
   b) putting said ingot into a die having an inlet portion and an outlet portion obliquely extending with respect to said inlet portion; and
   c) pressurizing said ingot for extruding a bulk of said thermoelectric material from said die unit at least once so that a shearing force is exerted on said ingot at a boundary between said inlet portion and said outlet portion.

24. A process for producing a thermoelectric material composed of at least one element selected from the group consisting of Bi and Sb and at least one element selected from the group consisting of Te and Se, the process comprising:

a) preparing a fusion of said thermoelectric material;

b) rapidly solidifying said fusion so as to obtain flakes of said thermoelectric material;

c) stacking said flakes so as to form a lamination, d) putting said lamination into a die unit having an inlet portion and an outlet portion obliquely extending with respect to said inlet portion; and e) pressurizing said lamination for extruding a bulk of said thermoelectric material from said die unit at least once so that a shearing force is exerted on said lamination at a boundary between said inlet portion and said outlet portion, in which a pressure is applied to said bulk of said thermoelectric material in a direction opposite to the direction in which said bulk is extruded.

25. A process for producing a thermoelectric material composed of at least one element selected from the group consisting of Bi and Sb and at least one element selected from the group consisting of Te and Se, the process comprising:

a) preparing one of an ingot of said thermoelectric material and a powder of said thermoelectric material;

b) putting said one of said ingot and said powder into a die having an inlet portion and an outlet portion obliquely extending with respect to said inlet portion; and c) pressurizing said one of said ingot and said powder for extruding a bulk of said thermoelectric material from said die unit at least once so that a shearing force is exerted on said one of said ingot and said powder at a boundary between said inlet portion and said outlet portion, in which a pressure is applied to said bulk of said thermoelectric material in a direction opposite to the direction in which said bulk is extruded.

26. A thermoelectric module for producing a temperature difference from an electric current passing therethrough, the thermoelectric module comprising:

a pair of substrates having respective inner surfaces opposite to each other;

conductive layers formed on said inner surfaces; and plural thermoelectric elements of a first conductivity type and other thermoelectric elements of a second conductivity type held in contact with said conductive layers so as to be alternately connected in series, each of the thermoelectric elements consisting of said plural thermoelectric elements and said other thermoelectric elements including a piece of thermoelectric material and metal layers, said piece of thermoelectric material being composed of at least one element selected from the group consisting of Bi and Sb and at least one element selected from the group consisting of Te and Se, said piece of thermoelectric material comprising crystal grains having respective [001] directions and an average grain size equal to or less than 30 microns, certain crystal grains having the [001] directions crossing a direction in which an electric current flows at 45 degrees or less, said certain crystal grains occupying an area equal to or less than 10% on a section perpendicular to said direction, said thermoelectric material having a density equal to or greater than 98% with respect to the density of $Bi_2Te_3$ said thermoelectric material having crystal grains with (001) crystal planes substantially parallel to said direction at a certain ratio, said grain size and said density so as to render the figure of merit equal to or greater than $3.0 \times 10^{-3}/K$.

27. The thermoelectric module as set forth in claim 26, in which said thermoelectric material contains at least one element selected from the group consisting of I, Cl, Hg, Br, Ag and Cu.

28. The thermoelectric module as set forth in claim 26, in which said piece of thermoelectric material has a cross section perpendicular to said direction and equal to or greater than 4 $cm^2$.

29. A process for producing a thermoelectric material composed of at least one element selected from the group consisting of Bi and Sb and at least one element selected from the group consisting of Te and Se, the process comprising:

a) preparing powder of said thermoelectric material;

b) reducing said powder in hydrogen;

c) putting said powder into a die having an inlet portion and an outlet portion obliquely extending with respect to said inlet portion; and d) pressurizing said powder for extruding a bulk of said thermoelectric material from said die unit at least once so that a shearing force is exerted on said powder at a boundary between said inlet portion and said outlet portion.

* * * * *